(12) United States Patent
Hayata et al.

(10) Patent No.: US 10,118,246 B2
(45) Date of Patent: Nov. 6, 2018

(54) MOUNTING APPARATUS

(71) Applicant: Shinkawa Ltd., Tokyo (JP)

(72) Inventors: Shigeru Hayata, Tokyo (JP); Hiroya Yuzawa, Tokyo (JP); Yusuke Matsuki, Tokyo (JP)

(73) Assignee: SHINIKAWA LTD., Tokyo (JP)

(*) Notice: Subject to any disclaimer, the term of this patent is extended or adjusted under 35 U.S.C. 154(b) by 0 days.

(21) Appl. No.: 15/632,570

(22) Filed: Jun. 26, 2017

(65) Prior Publication Data
US 2017/0291251 A1 Oct. 12, 2017

Related U.S. Application Data

(63) Continuation of application No. PCT/JP2015/080005, filed on Oct. 23, 2015.

(30) Foreign Application Priority Data

Dec. 26, 2014 (JP) .................. 2014-265603

(51) Int. Cl.
*B23K 31/02* (2006.01)
*B23K 37/00* (2006.01)
(Continued)

(52) U.S. Cl.
CPC .......... *B23K 20/002* (2013.01); *B23K 20/005* (2013.01); *B23K 37/04* (2013.01);
(Continued)

(58) Field of Classification Search
CPC .. B23K 20/002; B23K 20/106; B23K 20/004; B23K 20/005; B23K 20/007;
(Continued)

(56) References Cited

U.S. PATENT DOCUMENTS 4,515,651 A * 5/1985 MacLaughlin ... B29C 66/83221
156/379.8
5,884,831 A * 3/1999 Sato ....................... B23K 20/10
228/49.5

(Continued)

FOREIGN PATENT DOCUMENTS

JP 06163647 A * 6/1994 ............ H01L 24/85
JP 9-139399 A 5/1997
(Continued)

OTHER PUBLICATIONS

International Search Report dated Jan. 12, 2016, from corresponding International Application No. PCT/JP2015/080005.

*Primary Examiner* — Kiley S Stoner
(74) *Attorney, Agent, or Firm* — Katten Muchin Rosenman LLP

(57) ABSTRACT

Provided is a bonding apparatus including a bonding stage 83 for heating a substrate (lead frame) 61 placed on the upper surface thereof or a semiconductor die 63 mounted on the substrate (lead frame) 61, an imaging device 20 arranged above the bonding stage 83 to image the substrate 61 placed on the bonding stage 83 or the semiconductor die 63 mounted on the substrate 61, and a standing wave generating device 35 for generating an ultrasonic standing wave in the space between the upper surface of the bonding stage 83 and the imaging device 20. This improves the accuracy of image position detection by the imaging device with a simple structure.

12 Claims, 18 Drawing Sheets

(51) Int. Cl.
*B23K 20/00* (2006.01)
*H01L 23/544* (2006.01)
*H01L 23/00* (2006.01)
*B23K 37/04* (2006.01)

(52) U.S. Cl.
CPC ............ *H01L 23/544* (2013.01); *H01L 24/78* (2013.01); *H01L 24/85* (2013.01); *H01L 24/97* (2013.01); *H01L 2224/78* (2013.01)

(58) Field of Classification Search
CPC ....... B23K 37/04–37/0461; B23K 1/06; H01L 24/97; H01L 24/78; H01L 23/544; H01L 24/85; H01L 2224/78; H01L 24/86
USPC .... 228/4.5, 180.5, 102–103, 105, 110.1, 1.1, 228/8–12, 44.7, 49.5
See application file for complete search history.

(56) References Cited

U.S. PATENT DOCUMENTS

| | | | | |
|---|---|---|---|---|
| 6,715,660 | B2 | 4/2004 | Seki et al. | |
| 6,827,247 | B1* | 12/2004 | Fan | B23K 20/10 228/1.1 |
| 2005/0133563 | A1* | 6/2005 | Kim | B23K 20/004 228/4.5 |
| 2005/0150932 | A1* | 7/2005 | Hosseini | B23K 20/004 228/180.5 |
| 2005/0179549 | A1* | 8/2005 | Ota | H01L 23/544 340/572.1 |
| 2011/0036897 | A1* | 2/2011 | Nakai | H01L 21/67092 228/1.1 |
| 2013/0056448 | A1* | 3/2013 | Kim | H01L 24/78 219/121.63 |
| 2013/0221067 | A1* | 8/2013 | Lee | H05K 13/046 228/1.1 |
| 2013/0292456 | A1* | 11/2013 | Safavi Ardebili | B23K 20/004 228/219 |
| 2014/0054277 | A1* | 2/2014 | Sugito | H01L 24/85 219/136 |
| 2014/0138426 | A1* | 5/2014 | Hagiwara | H01L 24/78 228/160 |
| 2014/0209663 | A1* | 7/2014 | Song | H01L 24/85 228/102 |
| 2015/0243627 | A1* | 8/2015 | Akiyama | H01L 24/78 228/102 |
| 2016/0052194 | A1* | 2/2016 | Nakai | B29C 66/1122 156/73.1 |

FOREIGN PATENT DOCUMENTS

| | | | | |
|---|---|---|---|---|
| JP | | 2829471 | B2 * 11/1998 | ............ H01L 24/85 |
| JP | | 11284016 | A * 10/1999 | ............ H01L 24/78 |
| JP | | 2980275 | B2 * 11/1999 | ............ H01L 24/78 |
| JP | | 2003-7759 | A    1/2003 | |

* cited by examiner

MOUNTING APPARATUS

TECHNICAL FIELD

The present invention relates to a structure of a mounting apparatus for mounting an electronic component on a substrate serving as a bonding target.

BACKGROUND ART

For assembling of semiconductor devices, bonding apparatuses are used such as die bonding apparatuses for mounting a semiconductor die on a substrate or a lead frame and wire bonding apparatuses for wire-connecting electrodes on a semiconductor die mounted on a substrate and electrodes on the substrate. In wire bonding apparatuses, a substrate sucked and fixed to a bonding stage or a semiconductor die mounted on the substrate is heated up to about 200 to 250 degrees C. and a bonding tool such as a capillary is used for thermal compression of a thin wire of, for example, gold, silver, or copper with an ultrasonic vibration applied thereto to electrodes on the substrate or the semiconductor die so that the metal thin wire is bonded to each electrode. Also, die bonding apparatuses employ a system in which a substrate sucked and fixed to a bonding stage with adhesive applied thereto is heated, onto which a semiconductor die is thermally compressed and then the adhesive is thermally cured so that the semiconductor die is fixed to the substrate or a system in which a lead frame sucked and fixed to a bonding stage is heated up to about 300 to 450 degrees C., onto which a semiconductor die is eutectically bonded so that the semiconductor die is fixed to the lead frame. Nowadays, flip-chip bonding methods are also employed in which bumps (projections) of, for example, solder are formed on electrodes on a substrate and electrodes on a semiconductor die in advance, and the semiconductor die is reversed and, with being held by a collet such that the electrodes are opposed to the substrate (face downward), heated so that the bumps become melted, while the substrate, which is sucked and fixed to a bonding stage, is heated up to about 200 degrees C. so that the bumps become melted, and then the bumps are brought into contact with each other to form a metallic bond so that the semiconductor die is bonded to the substrate. In such bonding apparatuses, it may be necessary for the substrate sucked and fixed to the bonding stage to be heated up to a temperature of about 200 degrees C. during bonding.

When the bonding stage is heated up to about 200 degrees C., the air over the bonding stage is heated by the bonding stage to move upward. The surrounding cold air then comes over the bonding stage and is heated by the bonding stage to move upward again, causing a circulation of air. Upon this, airs of different temperatures, that is, different densities due to rising air are mixed to cause air turbulence over the bonding stage.

Meanwhile, in such bonding apparatuses, the surface of the substrate sucked and fixed to the bonding stage or the semiconductor die mounted on the substrate are imaged and, based on the images, the positions of the electrodes on the substrate and the semiconductor die or the bonding position of the substrate are detected and, based on the detected positions, the position of the bonding tool is controlled. Air turbulence, if occurred over the bonding stage as described above, would come into the field of view of the imager for imaging the substrate sucked and fixed to the bonding stage or the semiconductor die, suffering from a problem that the accuracy of detection of the imaging position may decrease.

To address this, there has been proposed a method of blowing nitrogen gas or air into the field of view of the imager to blow off the air turbulence for improvement in the accuracy of position detection by the imager (see Patent document 1, for example).

CITATION LIST

Patent Document

Patent document 1: JP2003-7759A

SUMMARY OF INVENTION

Technical Problem

Such a related art method of blowing nitrogen gas or air as described in Patent document 1 suffers from a problem that large amounts of nitrogen gas may be required. Additionally, in such wire bonding apparatuses, in which discharge is generated between a discharge electrode and the tip end of a wire and, with the discharge heat, a free-air ball is formed at the tip end of the wire, blowing nitrogen gas or air would cause the temperature of the free-air ball to decrease rapidly, suffering from a problem that the bonding quality may decrease.

It is hence an object of the present invention to improve the accuracy of image position detection by an imaging device with a simple structure in a mounting apparatus.

Solution to Problem

A mounting apparatus according to the present invention includes a mounting stage for heating a bonding target placed on the upper surface thereof and an electronic component mounted on the bonding target, an imaging device arranged above the mounting stage to image the bonding target placed on the mounting stage or the bonding target and the electronic component, and a standing wave generating device for generating an ultrasonic standing wave in the space between the upper surface of the mounting stage and the imaging device.

In the mounting apparatus according to the present invention, the standing wave generating device may preferably include an ultrasonic speaker and a reflection surface for reflecting an ultrasonic wave emitted from the ultrasonic speaker.

In the mounting apparatus according to the present invention, the reflection surface may preferably be a surface of a flat plate arranged in a manner opposed to the ultrasonic speaker.

In the mounting apparatus according to the present invention, the imaging device may preferably be movable in an XY direction, and the flat plate may preferably be arranged to move together with the imaging device in the XY direction.

In the mounting apparatus according to the present invention, the distance between the optical axis of the imaging device and the surface of the flat plate may preferably be $(2n-1)/4$ times (n is a positive integer) the wavelength $\lambda$ of the ultrasonic wave so that an anti-node of the standing wave is positioned in the vicinity of the optical axis.

The mounting apparatus according to the present invention may preferably further include a wind clamper for pressing the bonding target or the surface of the bonging target on which the electronic component is mounted toward the mounting state, in which the flat plate is attached to the upper surface of the wind clamper in an end portion farther from the ultrasonic speaker.

In the mounting apparatus according to the present invention, the reflection surface may preferably be composed of a surface of a half mirror arranged in an inclined manner between the imaging device and the mounting stage and the surface of the bonding target placed on the mounting stage.

In the mounting apparatus according to the present invention, the reflection surface may preferably be composed of a surface of a curved mirror arranged in a manner opposed to the ultrasonic speaker and a surface of a flat plate arranged in a manner opposed to the curved mirror with the ultrasonic speaker and the mounting stage therebetween.

In the mounting apparatus according to the present invention, the curved mirror may preferably be a parabolic mirror or an ellipsoidal mirror.

In the mounting apparatus according to the present invention, the standing wave generating device may preferably include two ultrasonic speakers arranged in a manner opposed to each other.

In the mounting apparatus according to the present invention, the standing wave generating device may preferably be a piezoelectric element arranged between the imaging device and the mounting stage to form a tube opened toward the mounting stage, and a standing wave region may preferably be formed between the opening and the upper surface of the mounting stage. Also, in the mounting apparatus according to the present invention, the bonding target may preferably be a substrate or a lead frame.

Advantageous Effect of the Invention

The present invention exhibits an effect that the accuracy of image position detection by the imaging device can be improved with a simple structure in the mounting apparatus.

DESCRIPTION OF EMBODIMENTS

Figure 1:
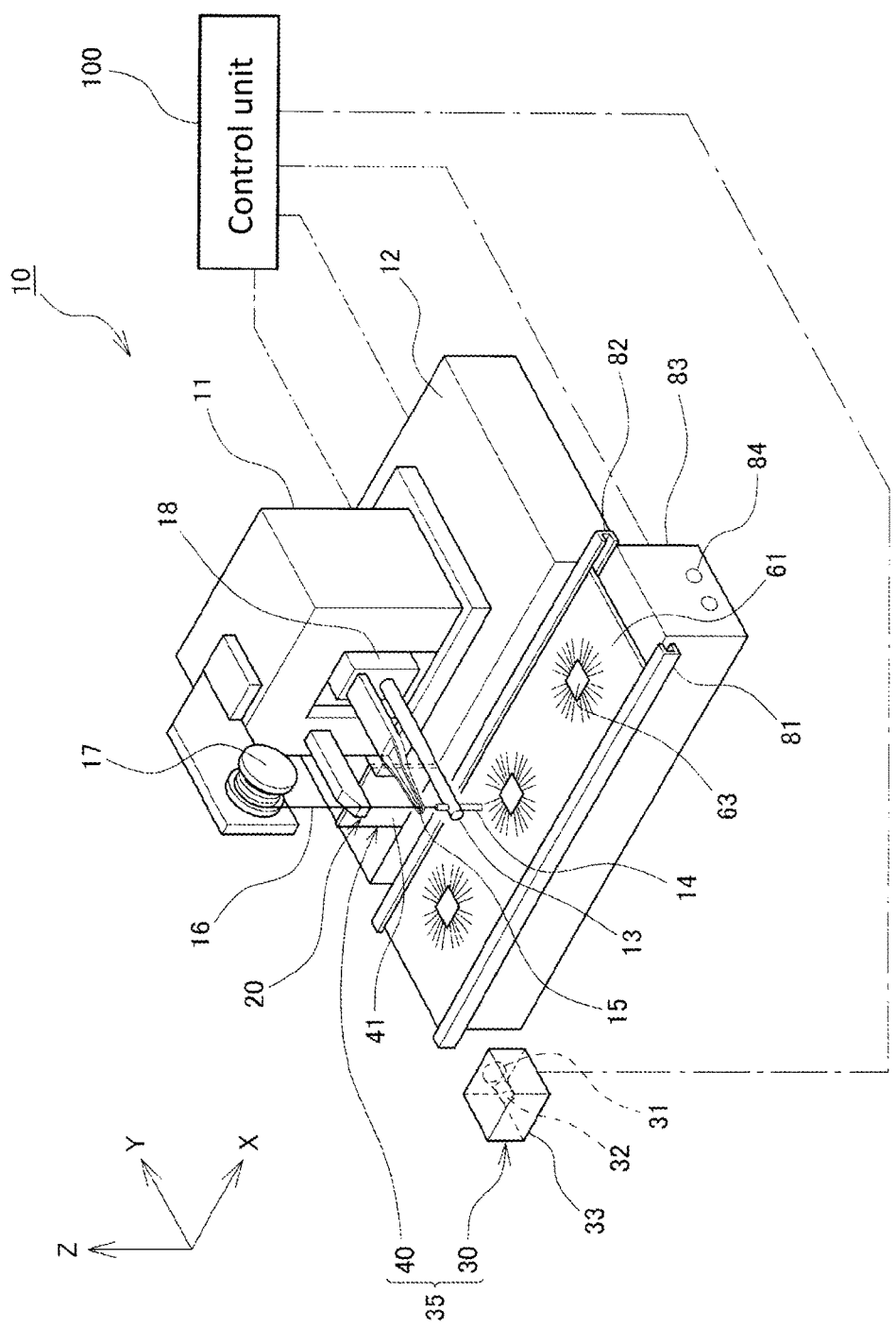
FIG. 1 is a perspective view showing a wire bonding apparatus according to an embodiment of the present invention.

The case where the present invention is applied to a wire bonding apparatus serving as a mounting apparatus for mounting a wire between a semiconductor die 63 and a substrate (lead frame) 61 serving as a bonding target will hereinafter be described with reference to the accompanying drawings. As shown in FIG. 1, the wire bonding apparatus 10 includes two guide rails 81, 82 for guiding the substrate (lead frame) 61 with the semiconductor die 63 mounted on the surface thereof in a feed direction (X direction), a bonding stage 83 serving as a mounting stage arranged at a lower position between the guide rails 81, 82 to vacuum-suck the substrate (lead frame) 61, an XY table 12 arranged adjacent to the bonding stage 83 in a direction (Y direction) perpendicular to the substrate 61 feed direction (X direction), a bonding head 11 installed on the XY table 12, a Z-direction drive mechanism 18 installed in the bonding head 11 to drive a clamper 15 and an ultrasonic horn 13 in a vertical direction (Z direction), an imaging device 20 attached to the bonding head 11, a flat plate 40, an ultrasonic speaker 30 arranged in a manner opposed to the flat plate 40, and a control unit 100 for controlling operations of the wire bonding apparatus 10.

As shown in FIG. 1, the bonding stage 83 includes a heater 84 therein and is arranged to heat the substrate (lead frame) 61 vacuum-sucked on the surface of the bonding stage 83 or the semiconductor die 63 mounted on the surface of the substrate (lead frame) 61 up to about 200 degrees C. during bonding. A capillary 14 serving as a bonding tool is attached to the leading end of the ultrasonic horn 13, and a bonding wire 16 to be fed from a spool 17 attached to an upper portion of the bonding head 11 is inserted through the capillary 14. The tip end of the capillary 14 is arranged to be driven by the Z-direction drive mechanism 18 in a direction (Z direction) coming into contact with and moving away from the substrate (lead frame) 61 to bond the wire 16 to electrodes (pads) on the semiconductor die 63 or electrodes (leads) on the substrate (lead frame) 61.

Figure 2:
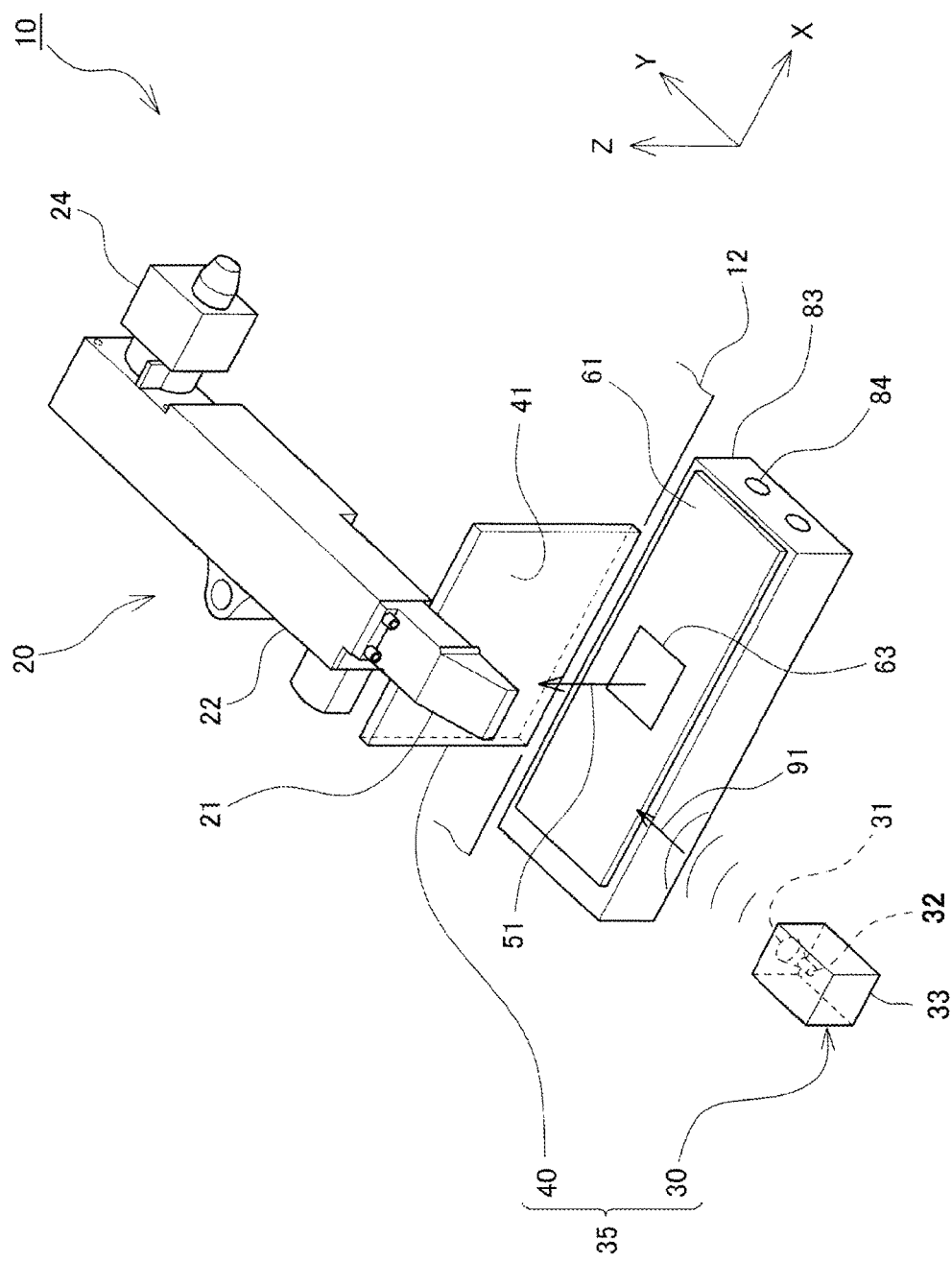
FIG. 2 is a partially enlarged perspective view showing the arrangement of an imaging device, an ultrasonic speaker, and a flat plate of the wire bonding apparatus according to the embodiment of the present invention.
Figure 3:
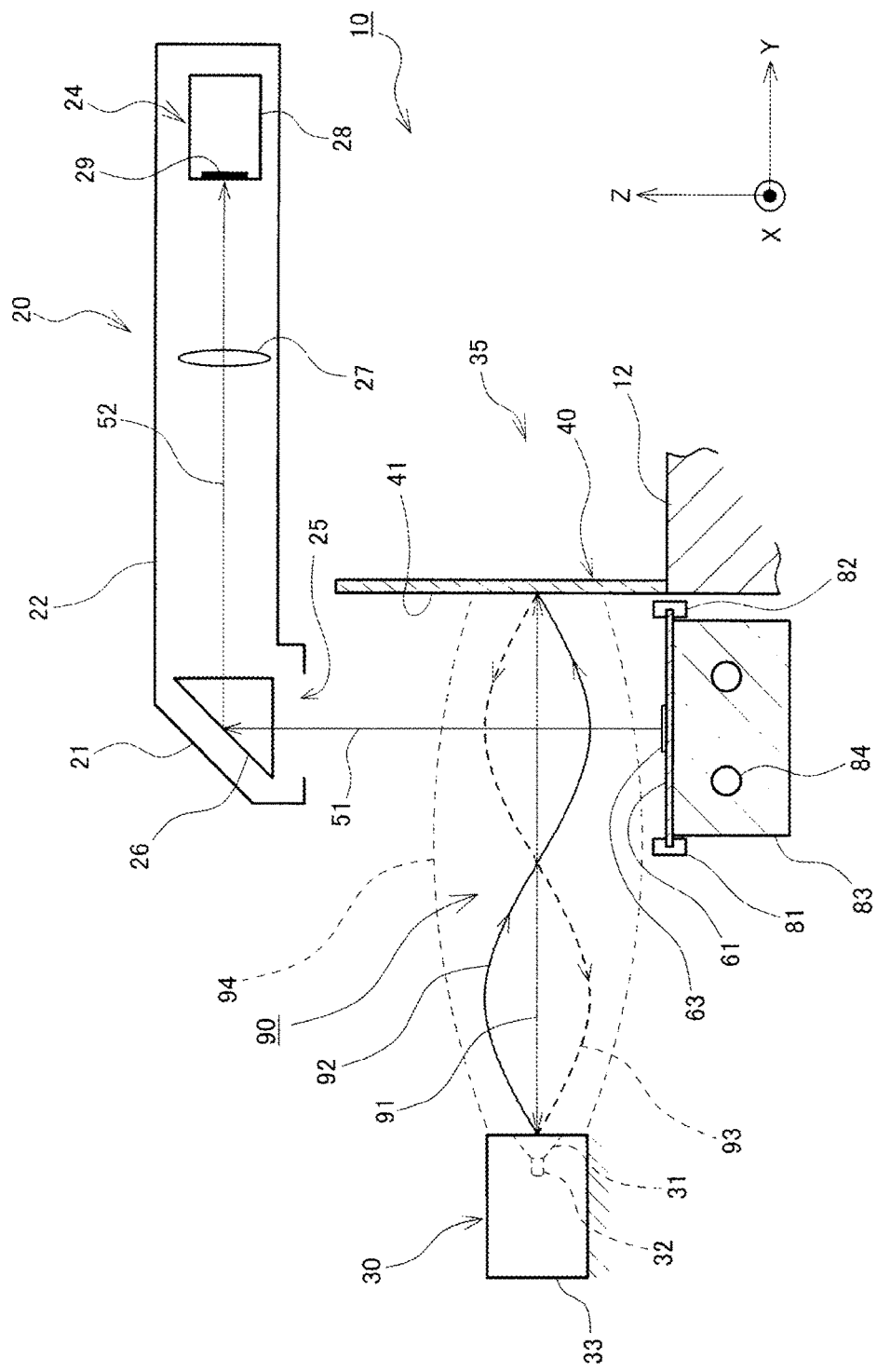
FIG. 3 is a side view of the wire bonding apparatus in which a standing wave generating device is composed of the ultrasonic speaker and the flat plate according to the embodiment of the present invention.

As shown in FIG. 2, the imaging device 20, the leading end of which extends to be positioned over the bonding stage 83, includes an introducing portion 21 for introducing light from the semiconductor die 63 or the substrate (lead frame) 61 serving as a subject along the optical axis 51 through an opening 25 and refracting the light by 90 degrees at a prism 26 and a lens tube 22 including optical components such as a lens 27 to guide the light refracted at the prism 26 along the optical axis 52 into a camera 24, as shown in FIGS. 2 and 3. The light coming from the subject into the camera 24 forms an image on an imaging surface 29 of an imaging element 28 in the camera 24. The imaging element 28 is arranged to convert the formed image into an electrical signal and output the signal as an image signal to the control unit 100 to be described hereinafter.

As shown in FIGS. 2 and 3, the flat plate 40 is a rigid plate (e.g. metal plate) attached to a fixed portion (a frame portion immovable in the XY direction) of the XY table 12 below the imaging device 20 to allow for reflection of an ultrasonic wave. The ultrasonic speaker 30 is also arranged opposite to the XY table 12 with respect to the bonding stage 83 in a manner opposed to the flat plate 40. The ultrasonic speaker 30 is composed of a chassis 33, a vibrating body 31 housed in the chassis 33 to undergo ultrasonic vibration, and a piezoelectric element 32 for driving the vibrating body 31. The vibrating body 31 is, for example, an ultrasonically oscillatable disk. As will be described below, an ultrasonic wave emitted from the ultrasonic speaker 30 is reflected at the surface 41 of the flat plate 40 to generate an ultrasonic standing wave 90 in the space between the ultrasonic speaker 30 and the flat plate 40. The surface 41 is therefore a reflection surface that reflects the ultrasonic wave, and the ultrasonic speaker 30 and the surface 41 of the flat plate 40 form a standing wave generating device 35. It is noted that ultrasonic wave is an acoustic wave with a frequency higher than the human audible field and generally means an acoustic wave with a frequency of 2 kHz or higher. In the description of this embodiment, the ultrasonic speaker 30 emits an ultrasonic wave with a frequency of 4 kHz.

The XY table 12, the Z-direction drive mechanism 18, and the ultrasonic speaker 30 are connected to the control unit 100 to operate under the command of the control unit 100. The control unit 100 is a computer including a CPU for arithmetic processing of signals and a memory unit. The imaging device 20 is also connected to the control unit 100, to which image signals from the imaging element 28 are input. The control unit 100 is arranged to process the image signals input from the imaging element 28 to recognize the substrate (lead frame) 61 or the semiconductor die 63 and detect the position of the substrate (lead frame) 61 or the semiconductor die 63.

A basic bonding operation of the thus arranged wire bonding apparatus 10 will be described briefly. As shown in FIG. 2, the control unit 100 of the wire bonding apparatus 10 adjusts the position of the bonding head 11 using the XY table 12 such that the optical axis 51 of the imaging device 20 is positioned immediately above the semiconductor die 63 or the substrate (lead frame) 61 subjected to position detection. When the optical axis 51 of the imaging device 20 then comes immediately above the semiconductor die 63 or the substrate (lead frame) 61 subjected to position detection, the semiconductor die 63 or the substrate (lead frame) 61 is imaged and, based on the acquired image, the positions of the electrodes (pads) on the semiconductor die 63 or the electrodes (leads) on the substrate (lead frame) 61. Next, the control unit 100 moves the bonding head 11 using the XY table 12 such that the position of the capillary 14 is aligned with the position of each electrode (pad) on the semiconductor die 63. The Z-direction drive mechanism 18 is then operated to drive the capillary 14 attached to the leading end of the ultrasonic horn 13 in the Z direction and thermally compress (bond) the wire 16 inserted through the capillary 14, with an ultrasonic vibration applied thereto, against the electrodes (pads) on the semiconductor die 63 or the electrodes (leads) on the substrate (lead frame) 61 so that the electrodes (pads) on the semiconductor die 63 and the electrodes (leads) on the substrate (lead frame) 61 are connected with the wire 61. During this, the substrate (lead frame) 61 or the semiconductor die 63 mounted on the substrate (lead frame) 61 is heated up to about 200 degrees C. with the heater 84 incorporated in the bonding stage 83.

After the bonding between one of the electrodes (pads) on the semiconductor die 63 and one of the electrodes (leads) on the substrate (lead frame) 61 is completed, the control unit 100 of the wire bonding apparatus 10 then moves the capillary 14 over the next electrode (pad) using the XY table 12 to bond the wire 16 between the electrode (pad) and the corresponding electrode (lead) in a manner similar to that above. After all the electrodes (pads) on the one semiconductor die 63 are connected to the respective electrodes (leads) on the substrate (lead frame) 61 using the wire 16, the control unit 100 then carries the substrate (lead frame) 61 such that the next semiconductor die 63 comes to the bonding position. Similarly to the case above, the control unit 100 moves the optical axis 51 of the imaging device 20 to immediately above the next semiconductor die 63 to image the semiconductor die 63 and the substrate (lead frame) 61 and, based on the acquired image, position the capillary 14 and then performs wire bonding. The same process will subsequently be repeated until the electrodes (pads) on all the semiconductor dies 63 have been connected to the electrodes (leads) on the substrates (lead frames) 61.

Next will be described an operation of the standing wave generating device 35 formed by the ultrasonic speaker 30 and the flat plate 40. The control unit 100 of the wire bonding apparatus 10 operates the piezoelectric element 32 of the ultrasonic speaker 30 to vibrate the vibrating body 31 and thereby to cause the vibrating body 31 to emit an ultrasonic progressive wave 92 in the direction indicated by the arrow 91 toward the surface 41 of the flat plate 40, as shown in FIG. 3. The ultrasonic progressive wave 92 emitted from the ultrasonic speaker 30 is reflected at the surface 41 of the flat plate 40 to come back to the ultrasonic speaker 30 as an ultrasonic reflected wave 93. The control unit 100 controls the piezoelectric element 32 of the ultrasonic speaker 30 to adjust the vibration frequency of the vibrating body 31 such that the distance between the vibrating body 31 of the ultrasonic speaker 30 and the surface 41 of the flat plate 40 is equal to the integral multiple of the wavelength of the ultrasonic progressive wave 92 emitted from the ultrasonic speaker 30. As shown in FIG. 3, this generates a standing wave 90 between the vibrating body 31 of the ultrasonic speaker 30 and the surface 41 of the flat plate 40. The standing wave 90 is generated in the region of the space 94 between the substrate (lead frame) 61 sucked and fixed onto the bonding stage 83 and the imaging device 20. The optical axis 51 thus passes through the space 94 in which the standing wave 90 is generated to reach the opening 25 of the imaging device 20. It is noted that FIG. 3 schematically shows the case where the distance between the vibrating body 31 and the surface 41 is equal to the wavelength $\lambda$ of the ultrasonic wave. Also, in FIG. 3, the ultrasonic wave, which is a compression wave (longitudinal wave) of air, is schematically shown as a sinusoidal transverse wave. It is noted that instead of adjusting the vibration frequency of the vibrating body 31, the standing wave 90 may be generated by adjusting the distance between the ultrasonic speaker 30 and the surface 41 of the flat plate 40.

Figure 5:
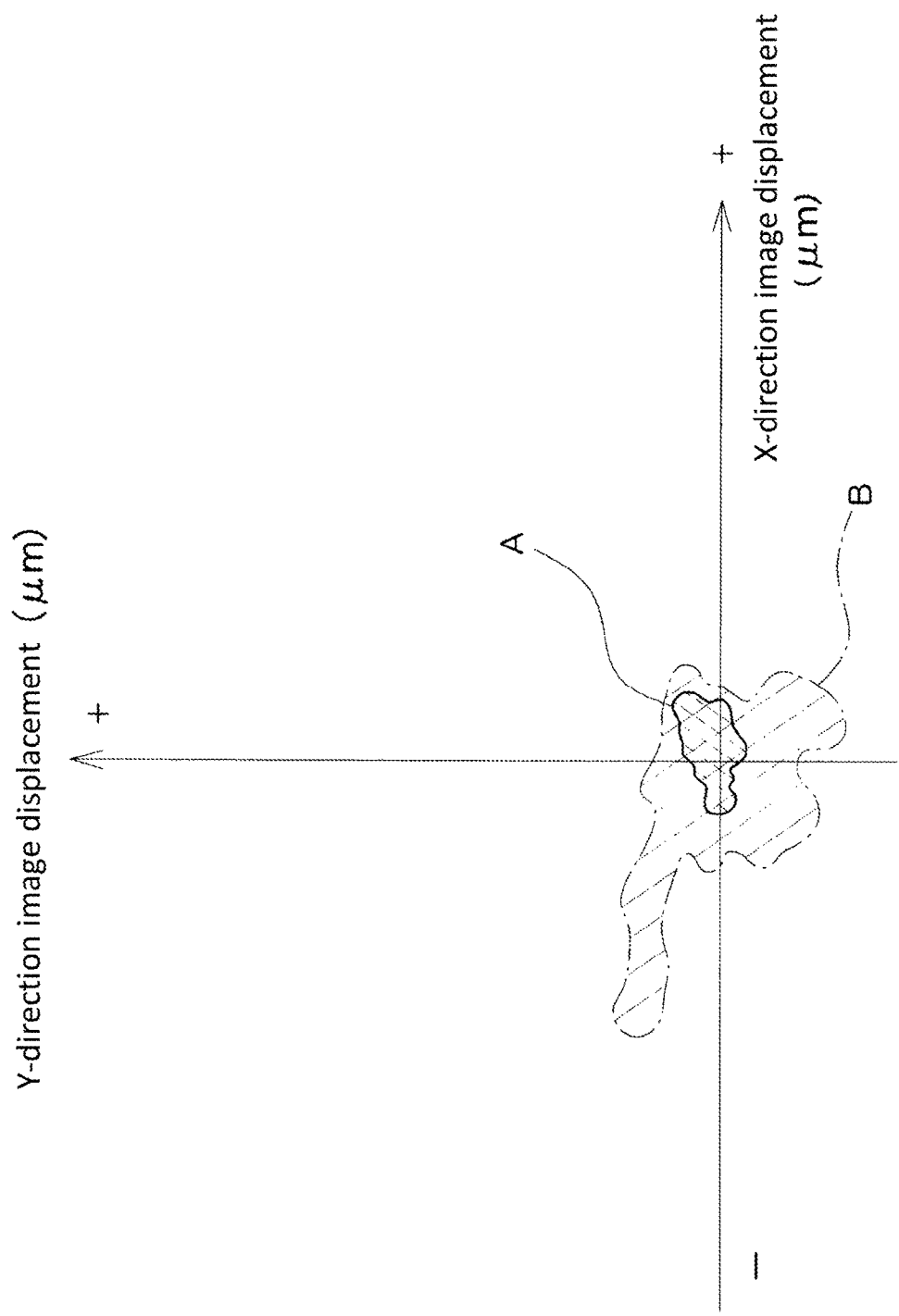
FIG. 5 is a graph showing ranges of the XY-direction displacement of images acquired by the imaging device.
Figure 6:
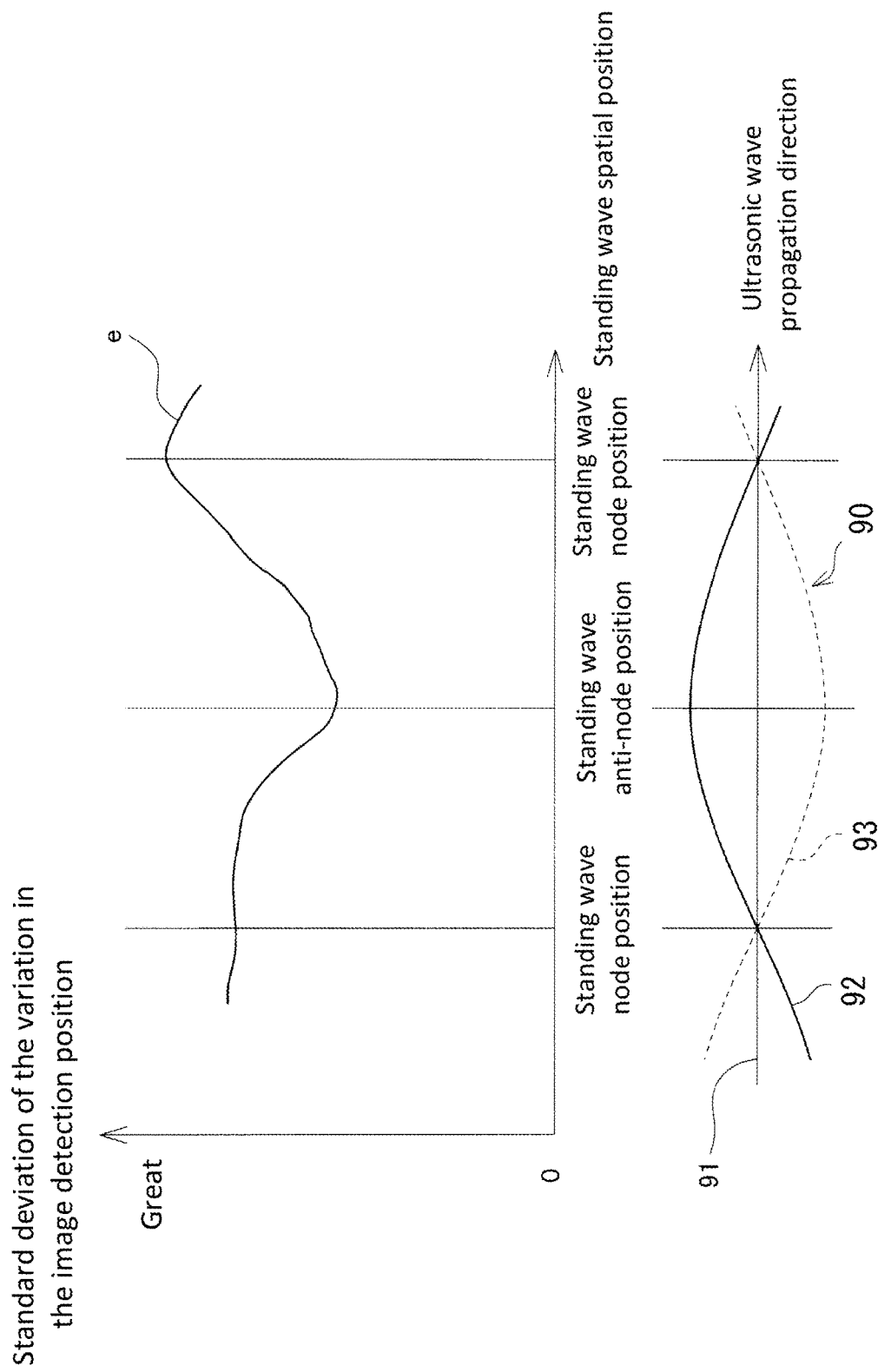
FIG. 6 is a graph showing a change in the standard deviation of the variation in the image detection position with respect to the spatial position of a standing wave.

As described above, the substrate 61 or the semiconductor die 63 mounted on the substrate (lead frame) 61 is heated up to about 200 degrees C. with the heater 84 incorporated in the bonding stage 83. This causes the air in the vicinity of the surface of the bonding stage 83 or the substrate (lead frame) 61 to be heated to move upward. The air moves upward to the vicinity of the space 94 in which the standing wave 90 is generated and then flows in the Y direction to circumvent the space 94. When the air heated in the vicinity of the surface of the substrate (lead frame) 61 flows upward, the surrounding cold air comes onto the surface of the substrate (lead frame) 61. Thus, the air heated by the surface of the substrate (lead frame) 61 circulates between the surface of the substrate (lead frame) 61 and the space over it if no standing wave 90 exists, while the air does not circulate through the space 94 in which the standing wave 90 is generated if the standing wave 90 exists. This causes airs of different temperatures, that is, different densities due to rising air not to be mixed to reduce the occurrence of air turbulence in the space 94. As a result, images detected by the imaging device 20 are less likely to fluctuate, resulting in an improvement in the accuracy of image position detection, as shown in FIGS. 4 to 6.

Figure 4:
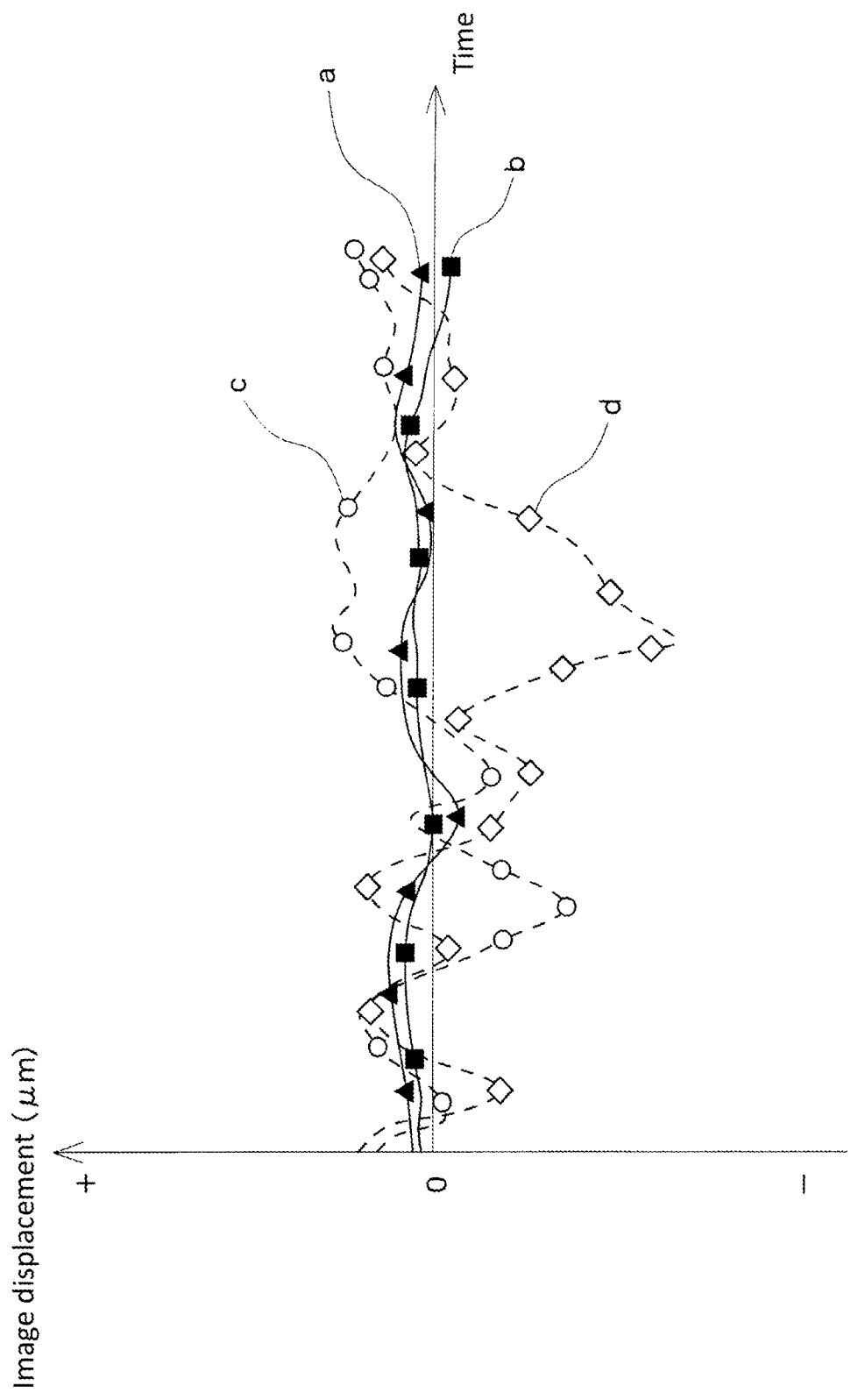
FIG. 4 is a graph showing temporal changes in the XY-direction displacement of images acquired by the imaging device.

FIG. 4 is a graph showing temporal changes in the displacement of images detected using the imaging device 20. The displacement of images was measured with the following method. First, a certain pattern of an imaging target such as the semiconductor die 63 was registered as a model and the change in the position of the model pattern was tracked through image processing using normalized correlation. In this method, the accuracy of position recognition for the model pattern is 0.12 μum. In FIG. 4, the solid line "a" with black triangle marks indicate a temporal change in the amount of X-direction displacement of an image in the case where the ultrasonic speaker 30 is turned on to generate a standing wave 90, the solid line "b" with black square marks indicate a temporal change in the amount of Y-direction displacement of an image in the case where the ultrasonic speaker 30 is turned on to generate a standing wave 90, the dashed line "c" with white circle marks indicate a temporal change in the amount of X-direction displacement of an image in the case where the ultrasonic speaker 30 is turned off to generate no standing wave 90, and the dashed line "d" with white rhombus marks indicate a temporal change in the amount of Y-direction displacement of an image in the case where the ultrasonic speaker 30 is turned off to generate no standing wave 90. As can be seen in FIG. 4, the lines "a" and "b" indicating the XY-direction displacement of each image in the case where the ultrasonic speaker 30 is turned on to generate a standing wave 90 hover around zero and the standard deviations of the amount of XY-direction displacement are, respectively, 0.27 μm and 0.17 μm, while the lines "c" and "d" indicating the XY-direction displacement of each image in the case where the ultrasonic speaker 30 is turned off to generate no standing wave 90 surges significantly apart from zero and the standard deviations of the amount of XY-direction displacement are, respectively, 1.1 μm and 0.8 μm. This shows that when the ultrasonic speaker 30 is turned on to generate a standing wave 90, the amount of temporal change in the displacement of images detected by the imaging device 20 decreases considerably. Also, FIG. 5 shows the amount of XY-direction displacement of each image plotted as ranges on the XY plane, where the diagonally right-up hatched range A surrounded by the solid line in the figure indicates the displacement of an image in the case where the ultrasonic speaker 30 is turned on to generate a standing wave 90, while the diagonally right-down hatched range B surrounded by the alternate long and short dash line in the figure indicates the displacement of an image in the case where the ultrasonic speaker 30 is turned off to generate no standing wave 90. As shown in FIG. 5, the area of the range A is smaller than the area of the range B, and when the ultrasonic speaker 30 is turned on to generate a standing wave 90, the amount of displacement of images detected by the imaging device 20 decreases considerably.

The variation in the image detection position also varies depending on the spatial position of the standing wave 90. As shown in FIG. 6, the variations in the detection position were detected and their standard deviations were calculated at the position of the node of the standing wave 90 (where air molecules do not move but the density of air changes), the position of the anti-node of the standing wave 90 (where air molecules move but the density of air does not change), and the middle position therebetween to find that the position of the anti-node of the standing wave 90 has a smaller variation compared to the other positions.

In summary, as shown in FIG. 3, when the ultrasonic speaker 30 generates a standing wave 90, the vibration frequency of the ultrasonic speaker 30 or the distance between the ultrasonic speaker 30 and the surface 41 of the flat plate 40 is adjusted such that the anti-body of the standing wave 90 is positioned in the vicinity of the optical axis 51 of the imaging device 20, whereby the occurrence of air turbulence can be reduced effectively and the temporal displacement or fluctuation of the image detection position by the imaging device 20 can also be reduced. As a result, unlike related art wire bonding apparatuses in which nitrogen gas or air is blown, the wire bonding apparatus according to this embodiment can improve the accuracy of image position detection by the imaging device 20 with a simple structure, whereby the bonding quality can be increased.

Other embodiments of the present invention will hereinafter be described with reference to FIGS. 7 to 13. Components identical to those described with reference to FIGS. 1 to 6 are designated by the same reference signs to omit the description thereof.

Figure 7:
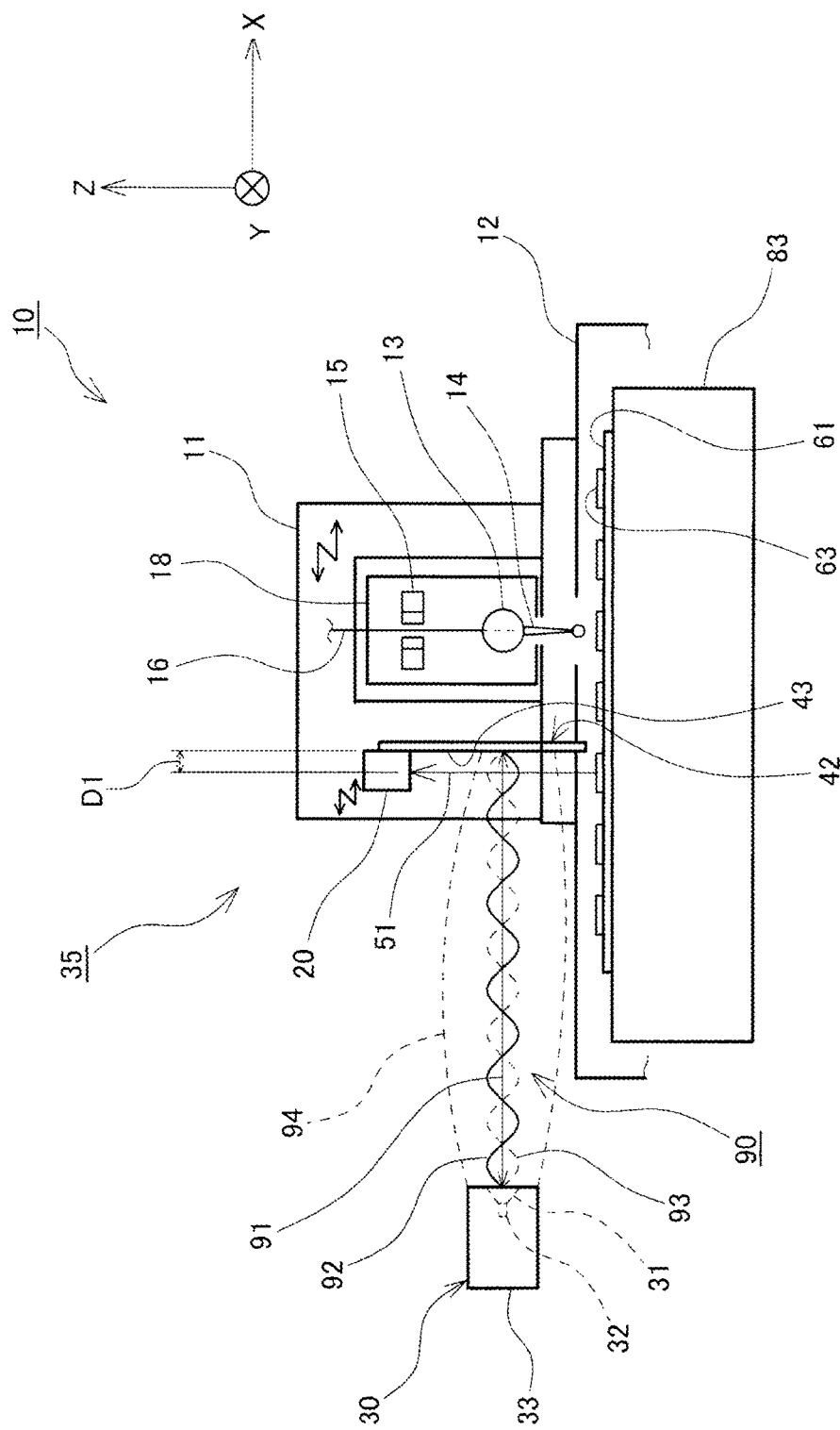
FIG. 7 is a front view of a wire bonding apparatus in which a standing wave generating device is composed of an ultrasonic speaker and a flat plate attached to an imaging device according to another embodiment of the present invention.

In the embodiment shown in FIG. 7, a flat plate 42 for reflecting an ultrasonic wave emitted from the ultrasonic speaker 30 is attached to the imaging device 20, and the distance D1 between a surface 43 of the flat plate 42 and the optical axis 51 of the imaging device 20 is made equal to 1/4 of the wavelength $\lambda$ of the ultrasonic wave. In this embodiment, the ultrasonic speaker 30 and the surface 43 of the flat plate 42 form a standing wave generating device 35. In accordance with this arrangement, the surface 43 always has a node and one of the anti-nodes of the standing wave 90 can always remain positioned in the vicinity of the optical axis 51 of the imaging device 20 even when the bonding head 11 may move in the XY direction, whereby the occurrence of air turbulence over the substrate (lead frame) 61 can be reduced effectively and the accuracy of image position detection by the imaging device 20 can be improved without adjusting the position of the ultrasonic speaker 30 with the movement of the bonding head 11. It is noted that although in FIG. 7, the ultrasonic speaker 30 is arranged to face in the X direction so that the standing wave 90 is generated in the X direction and the surface 43 of the flat plate 42 serving as a reflection surface for the ultrasonic wave is arranged in the YZ plane, the ultrasonic speaker 30 may be arranged to face in the Y direction so that the standing wave 90 is generated in the Y direction and the surface 43 of the flat plate 42 serving as a reflection surface for the ultrasonic wave may be arranged in the XZ plane. In addition, the flat plate 42 may be fixed not to the imaging device 20 but to the bonding head 11 as long as arranged such that the distance D1 between the surface 43 and the optical axis 51 is made equal to ¼ of the wavelength λ of the ultrasonic wave and movable together with the imaging device 20 in the XY direction. Further, the distance D1 between the surface 43 and the optical axis 51 may not be equal to 1/4 but equal to (2n−1)/4 times (n is a positive integer) the wavelength λ of the ultrasonic wave, that is, 3/4, 5/4, etc. as long as one of the anti-nodes of the standing wave 90 is positioned in the vicinity of the optical axis 51.

Figure 8:
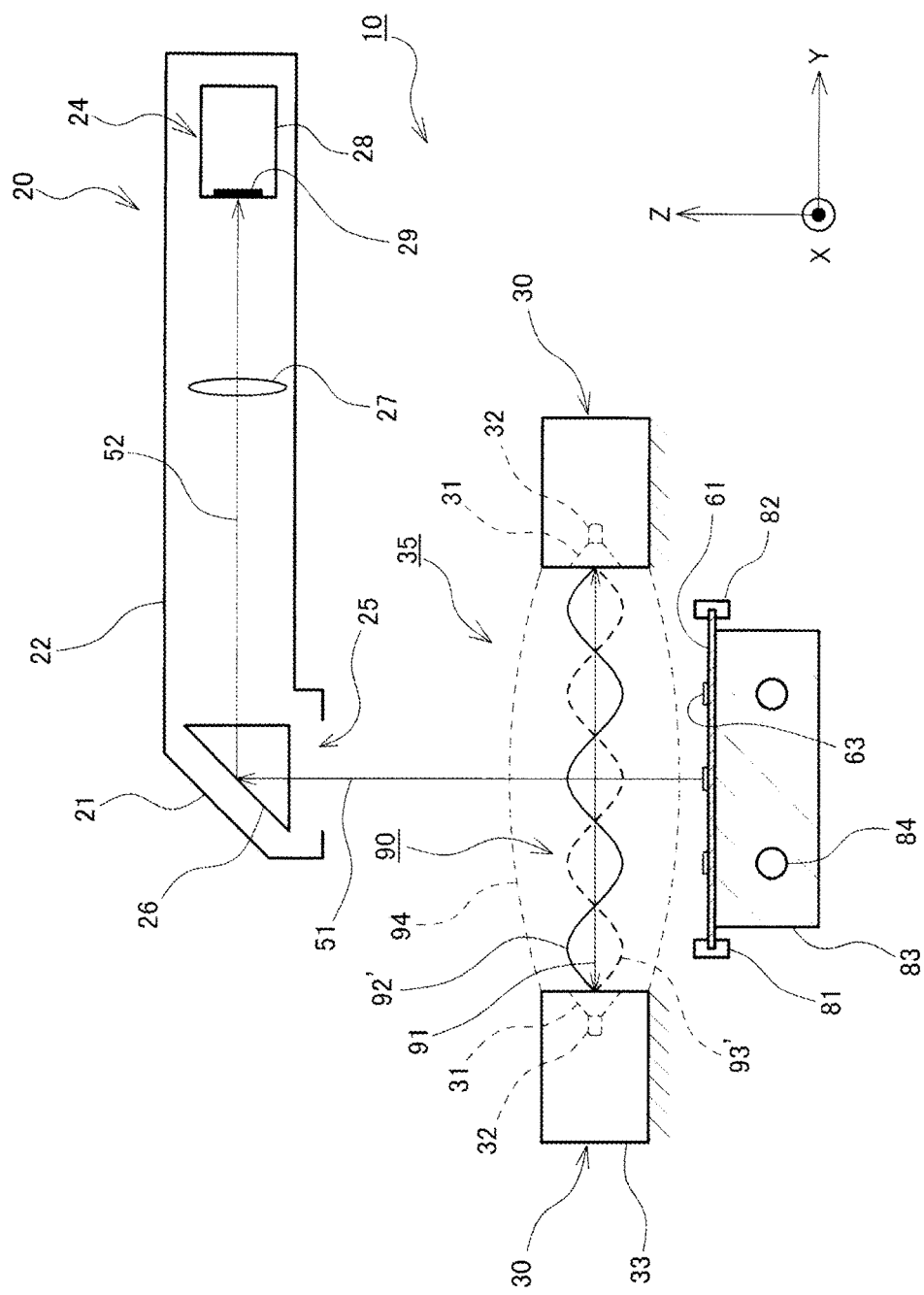
FIG. 8 is a side view of a wire bonding apparatus in which a standing wave generating device is composed of two ultrasonic speakers arranged in a manner opposed to each other according to still another embodiment of the present invention.

In the embodiment shown in FIG. 8, the flat plate 40 according to the embodiment described with reference to FIG. 3 is replaced with an ultrasonic speaker 30, whereby a standing wave 90 is generated between the two ultrasonic speakers 30 arranged in a manner opposed to each other. In this arrangement, the ultrasonic speakers 30 arranged in a manner opposed to each other form a standing wave generating device 35. Like the wire bonding apparatus 10 described with reference to FIG. 3, when an ultrasonic wave 92' is emitted in the direction indicated by the arrow 91 from the ultrasonic speaker 30 on the left in the figure to the ultrasonic speaker 30 on the right in the figure and an ultrasonic wave 93' of the same frequency is emitted from the ultrasonic speaker 30 on the right in the figure to the ultrasonic speaker 30 on the left in the figure, the ultrasonic waves 92' and 93' interfere with each other to generate a standing wave 90 between the two ultrasonic speakers 30. Unlike related art wire bonding apparatuses in which nitrogen gas or air is blown, this standing wave 90 can reduce the occurrence of air turbulence and thereby improve the accuracy of image position detection by the imaging device 20 with a simple structure, whereby the bonding quality can be increased.

Figure 9:
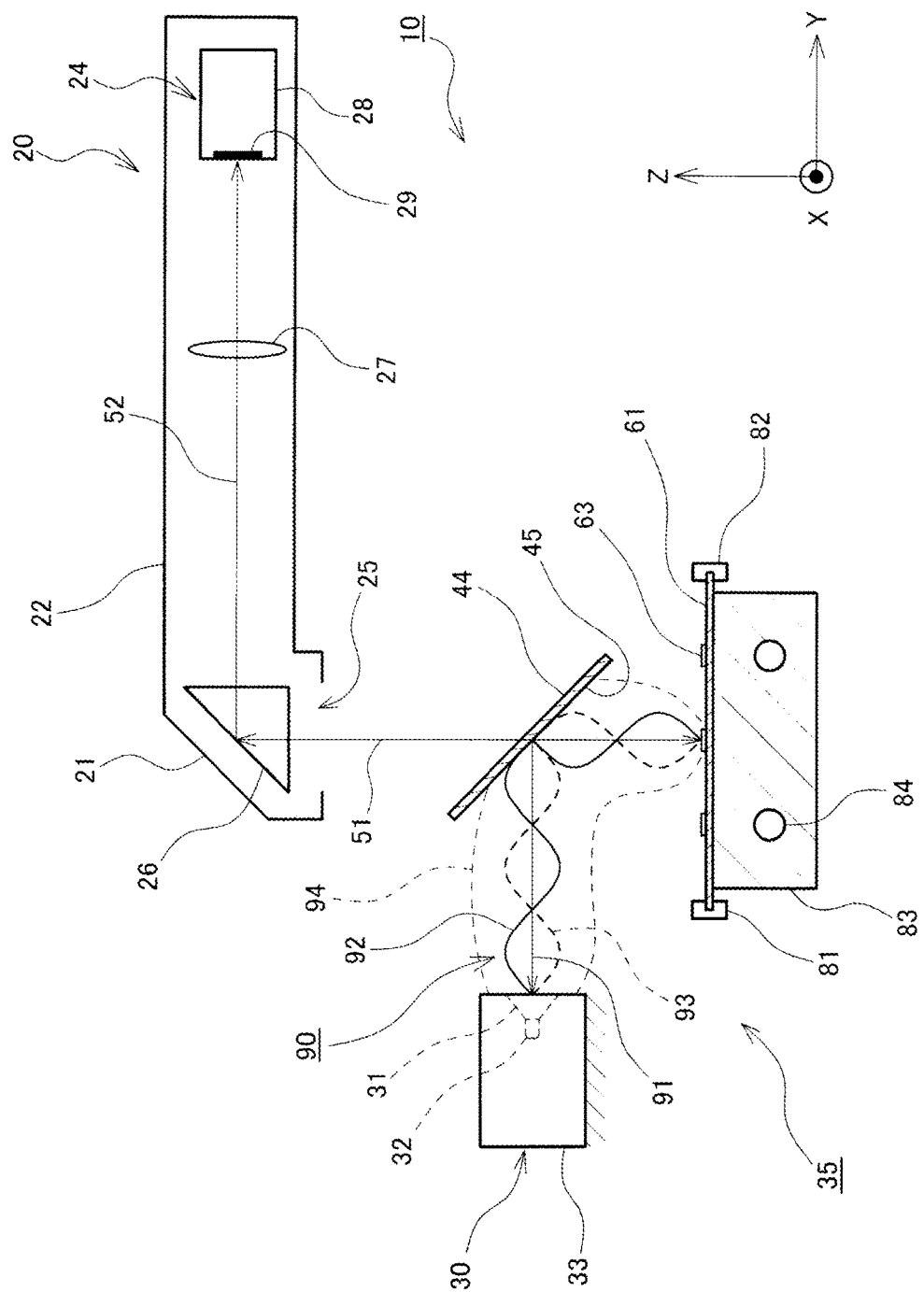
FIG. 9 is a side view of a wire bonding apparatus in which a standing wave generating device is composed of an ultrasonic speaker, a half mirror, and a bonding stage according to a further embodiment of the present invention.

In the embodiment shown in FIG. 9, a half mirror 44 is arranged in an inclined manner between the substrate (lead frame) 61 and the opening 25 of the imaging device 20. The half mirror 44 is arranged such that the surface 45 is inclined at 45 degrees with respect to the optical axis 51 or the surface of the substrate (lead frame) 61. As shown in FIG. 9, an ultrasonic progressive wave 92 emitted from the ultrasonic speaker 30 in the direction indicated by the arrow 91 is reflected at the surface 45 of the half mirror 44 to reach the surface of the substrate (lead frame) 61 or the semiconductor die 63 mounted on the surface of the substrate (lead frame) 61 along the optical axis 51. The substrate (lead frame) 61, which is sucked and fixed to the bonding stage 83, cannot vibrate and reflects the ultrasonic wave reaching the surface. The ultrasonic wave reflected at the surface of the substrate (lead frame) 61 travels upward as a reflected wave 93 along the optical axis 51 and is reflected at the surface 45 of the half mirror 44 to travel toward the ultrasonic speaker 30. The ultrasonic wave emitted from the ultrasonic speaker 30 is thus reflected at the surface 45 of the half mirror 44 and the surface of the substrate (lead frame) 61 sucked and fixed to the bonding stage 83 to generate a standing wave 90 in the space 94 bent at 90 degrees between the ultrasonic speaker 30 and the surface of the bonding stage 83, as shown in FIG. 9. Since the acoustic impedance of air is several orders of magnitude smaller than that of resins and metals, the ultrasonic wave is mainly reflected at the surface of the substrate (lead frame) 61. In this embodiment, the ultrasonic speaker 30, the surface 45 of the half mirror 44, and the surface of the substrate (lead frame) 61 therefore form the standing wave generating device 35. On the other hand, the light on the surface of the substrate (lead frame) 61 or the surface of the semiconductor die 63 passes through the half mirror 44 and reaches the opening 25 of the imaging device 20 to form an image on the imaging surface 29. This embodiment exhibits the same effect as the above-described embodiment, that is, unlike related art wire bonding apparatuses in which nitrogen gas or air is blown, the standing wave 90 can reduce the occurrence of air turbulence and thereby improve the accuracy of image position detection by the imaging device 20 with a simple structure, whereby the bonding quality can be increased.

Figure 10:
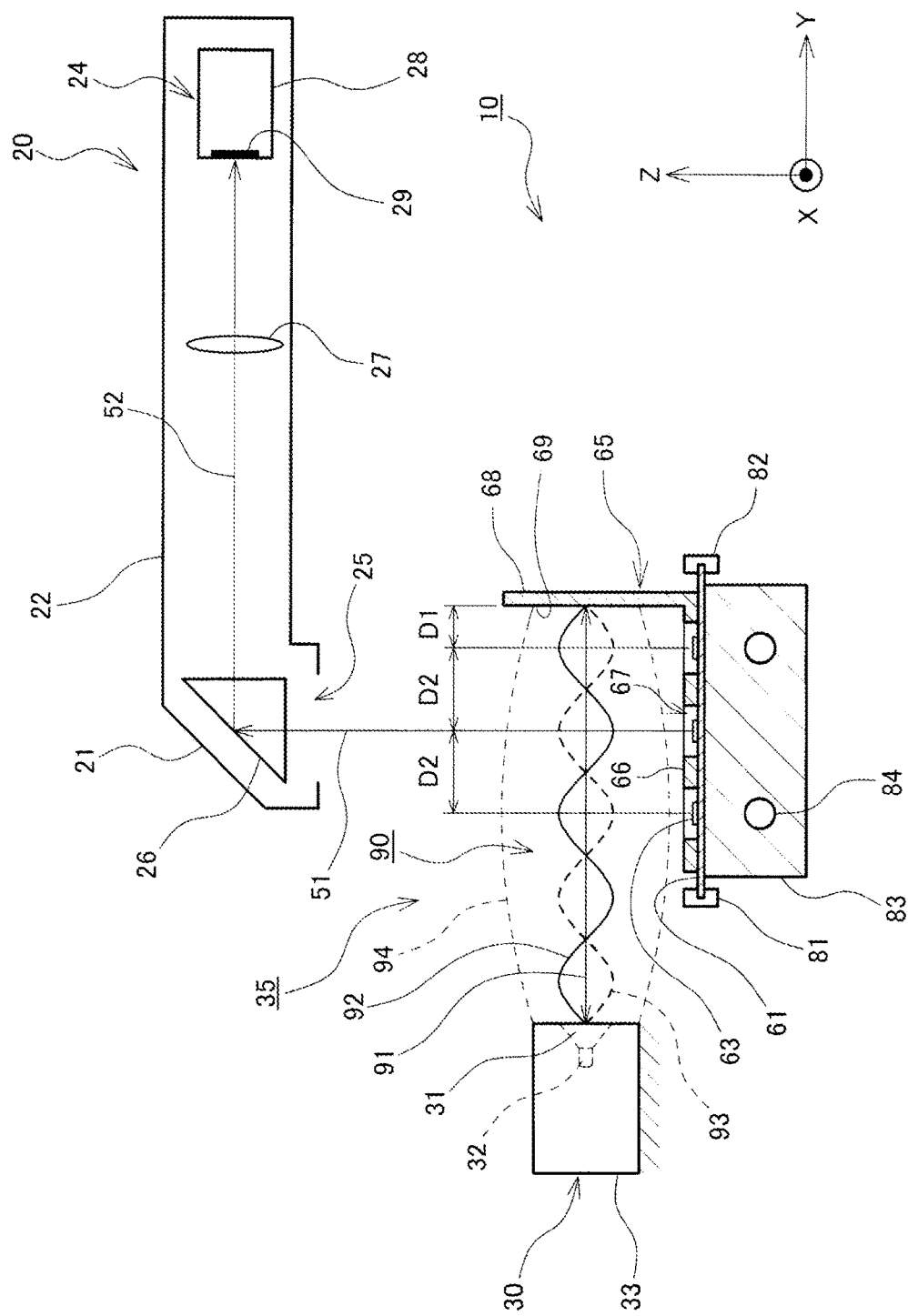
FIG. 10 is a front view of a wire bonding apparatus in which a standing wave generating device is composed of an ultrasonic speaker and a flat plate attached to an end portion of a wind clamper according to a still further embodiment of the present invention.

In the embodiment shown in FIG. 10, instead of the flat plate 40 according to the embodiment described with reference to FIG. 3, a surface 69 of a flat plate 68 attached to the upper surface of a wind clamper 65 is arranged to reflect an ultrasonic wave. As shown in FIG. 10, in this embodiment, semiconductor dies 63 in three rows in the Y direction are mounted on the substrate (lead frame) 61, and the wind clamper 65 is made of metal and formed by pressing portions 66 for pressing the substrate (lead frame) 61 between the semiconductor dies 63 against the bonding stage 83 and window portions 67 provided at positions corresponding to the semiconductor dies 63, in which the flat plate 68 is a metal plate and attached to the upper surface of an end portion of the pressing portion 66 farthest from the ultrasonic speaker 30. In this embodiment, the ultrasonic speaker 30 and the surface 69 of the flat plate 68 form a standing wave generating device 35.

In this embodiment, since the spacing between the semiconductor dies 63 is D2, anti-nodes of the standing wave 90 are positioned in the vicinity of the centers of the semiconductor dies 63 or the positioning recognition points by setting the distance between the surface 69 of the flat plate 68 and the center of the semiconductor die 63 to D1, which is half of D2, and adjusting the frequency of the ultrasonic wave such that the distance D1 is equal to 1/4 of the wavelength λ of the ultrasonic wave. As described with reference to FIG. 6, since the anti-nodes of the standing wave 90 each have a smaller variation in the image detection position, unlike related art wire bonding apparatuses in which nitrogen gas or air is blown, this embodiment, in which wire bonding may be performed on the substrate (lead frame) 61 with multiple semiconductor dies 63 mounted thereon in the Y direction, can effectively reduce the occurrence of air turbulence in the vicinity of the center of each semiconductor die 63 and thereby improve the accuracy of image position detection by the imaging device 20 with a simple structure, whereby the bonding quality can be increased. Further, since a portion of the part of the wind clamper 65 is utilized as a reflection surface for the ultrasonic wave, the number of parts can be reduced and the structure can be simplified.

Figure 11:
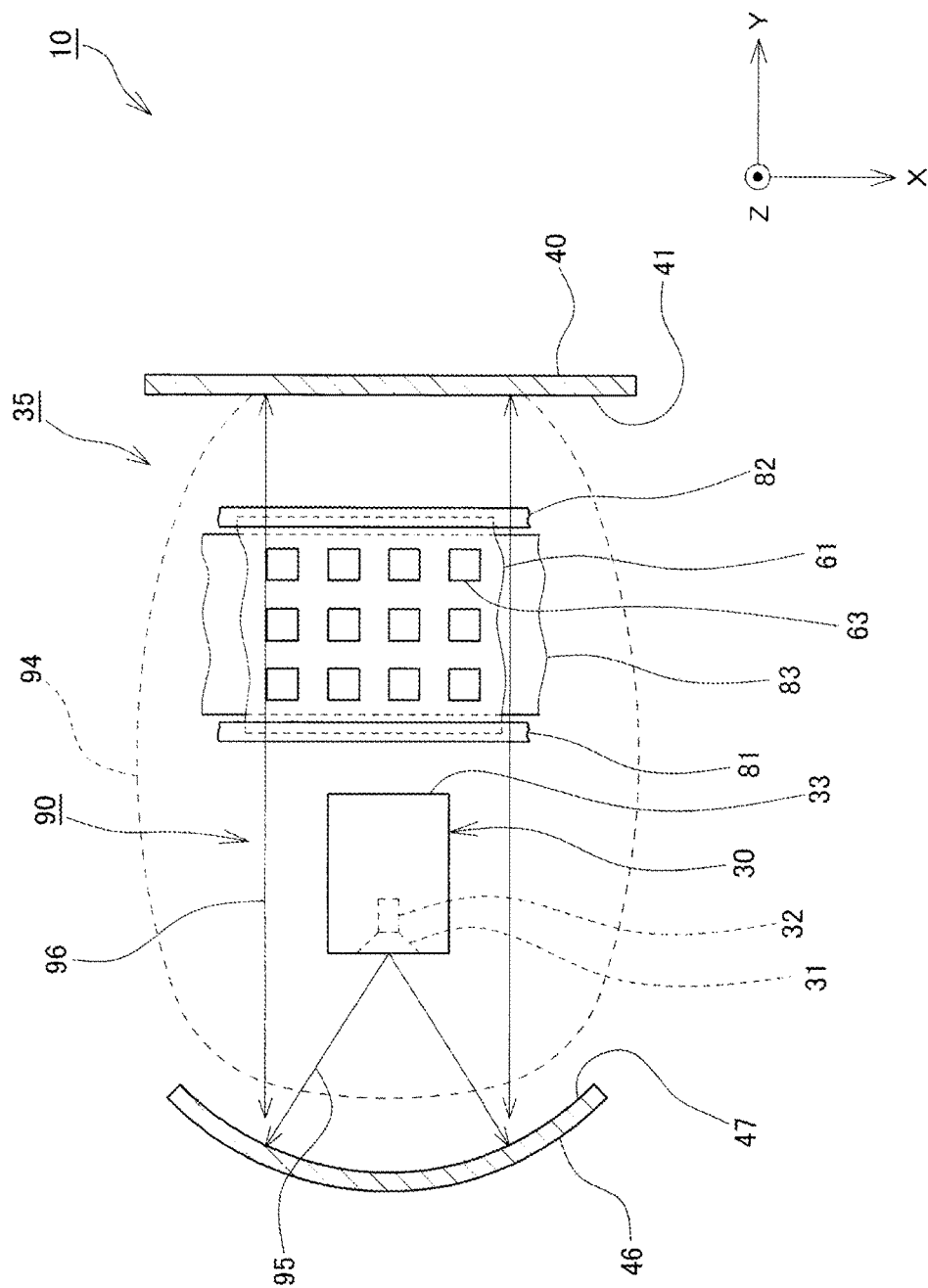
FIG. 11 is a side view of a wire bonding apparatus in which a standing wave generating device is composed of an ultrasonic speaker, a parabolic mirror, and a flat plate according to another embodiment of the present invention.

In the embodiment shown in FIG. 11, a parabolic mirror 46 is arranged in a manner opposed to the vibrating body 31 of the ultrasonic speaker 30 and the flat plate 40 is arranged on the opposite side with the ultrasonic speaker 30 and the bonding stage 83 therebetween. An ultrasonic wave emitted from the ultrasonic speaker 30 indicated by the arrow 95 in FIG. 11 is reflected at the surface 47 of the parabolic mirror 46 to travel toward the flat plate 40 as a parallel wave as indicated by the arrow 96 in FIG. 11 and reflected at the surface 41 of the flat plate 40 to come back to the ultrasonic speaker 30. This causes a standing wave 90 to be generated in the space 94 between the surface 47 of the parabolic mirror 46 and the surface 41 of the flat plate 40. In this embodiment, the ultrasonic speaker 30, the surface 47 of the parabolic mirror 46, and the surface 41 of the flat plate 40 form a standing wave generating device 35. This embodiment exhibits the same effect as the above-described embodiment, that is, unlike related art wire bonding apparatuses in which nitrogen gas or air is blown, the standing wave 90 can reduce the occurrence of air turbulence and thereby improve the accuracy of image position detection by the imaging device 20 with a simple structure, whereby the bonding quality can be increased.

Figure 12:
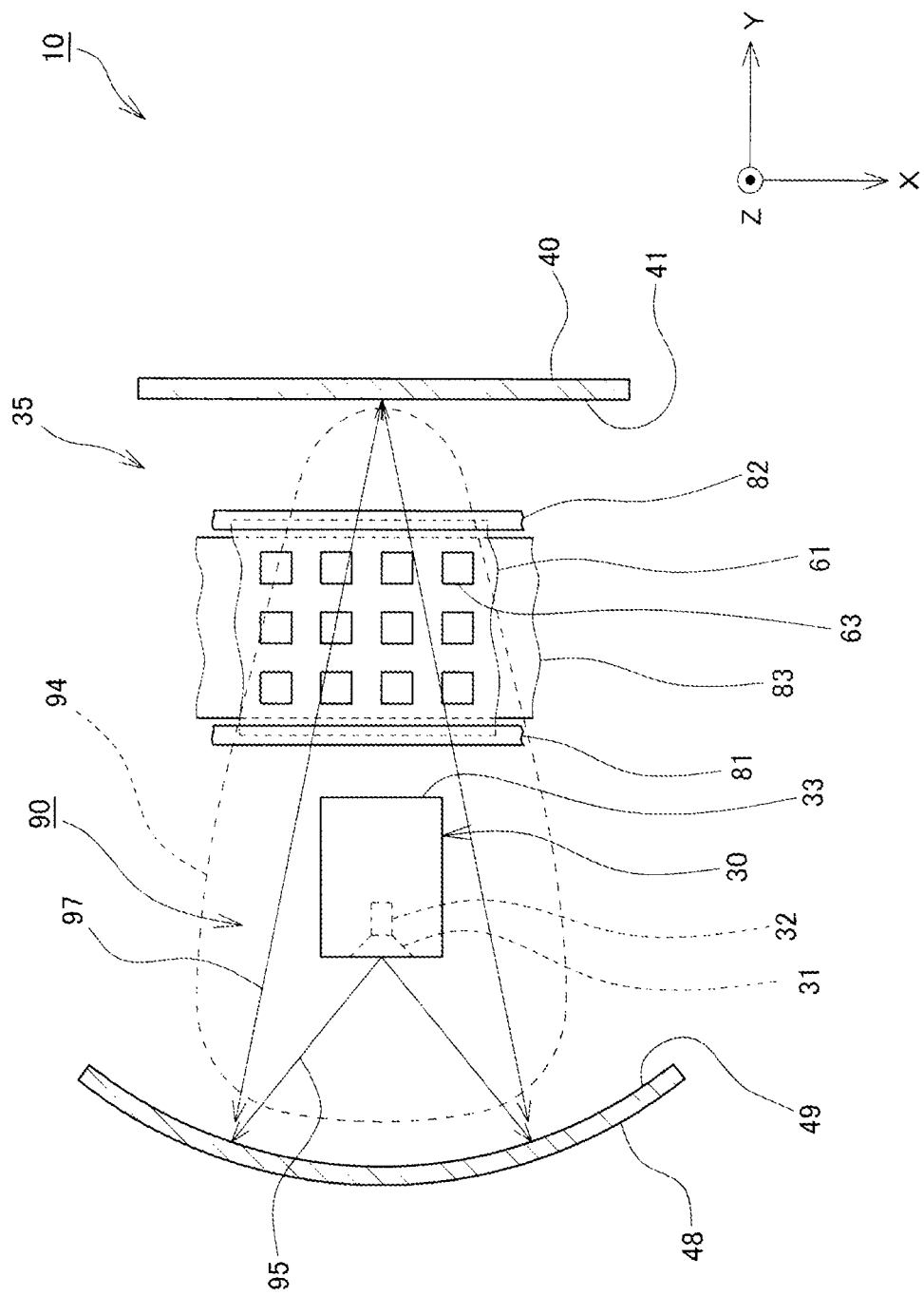
FIG. 12 is a side view of a wire bonding apparatus in which a standing wave generating device is composed of an ultrasonic speaker, an ellipsoidal mirror, and a flat plate according to still another embodiment of the present invention.

In the embodiment shown in FIG. 12, instead of the parabolic mirror 46 according to the embodiment shown in FIG. 11, an ellipsoidal mirror 48 is arranged. The ultrasonic speaker 30 is arranged at the first focal point of the ellipsoidal mirror 48, and the flat plate 40 is arranged such that the second focal point of the ellipsoidal mirror 48 is positioned at the surface 41. An ultrasonic wave emitted from the ultrasonic speaker 30 indicated by the arrow 95 in FIG. 12 is reflected at the surface 49 of the ellipsoidal mirror 48 to travel toward the flat plate 40 as a focused wave indicated by the arrow 97 in FIG. 12 and focused on the second focal point at the surface 41 of the flat plate 40 and also reflected at the surface 41 to come back to the ultrasonic speaker 30. This causes an ultrasonic standing wave 90 to be generated in the space 94 between the surface 49 of the ellipsoidal mirror 48 and the surface 41 of the flat plate 40. In this embodiment, the ultrasonic speaker 30, the surface 49 of the ellipsoidal mirror 48, and the surface 41 of the flat plate 40 form a standing wave generating device 35. In this embodiment, since the ellipsoidal mirror 48 is used to focus the ultrasonic wave on the surface 41 of the flat plate 40 and thereby to increase the strength of the standing wave 90 generated in the space 94, unlike related art wire bonding apparatuses in which nitrogen gas or air is blown, the occurrence of air turbulence can be reduced more effectively to thereby improve the accuracy of image position detection by the imaging device 20 with a simple structure, whereby the bonding quality can be increased.

Figure 13:
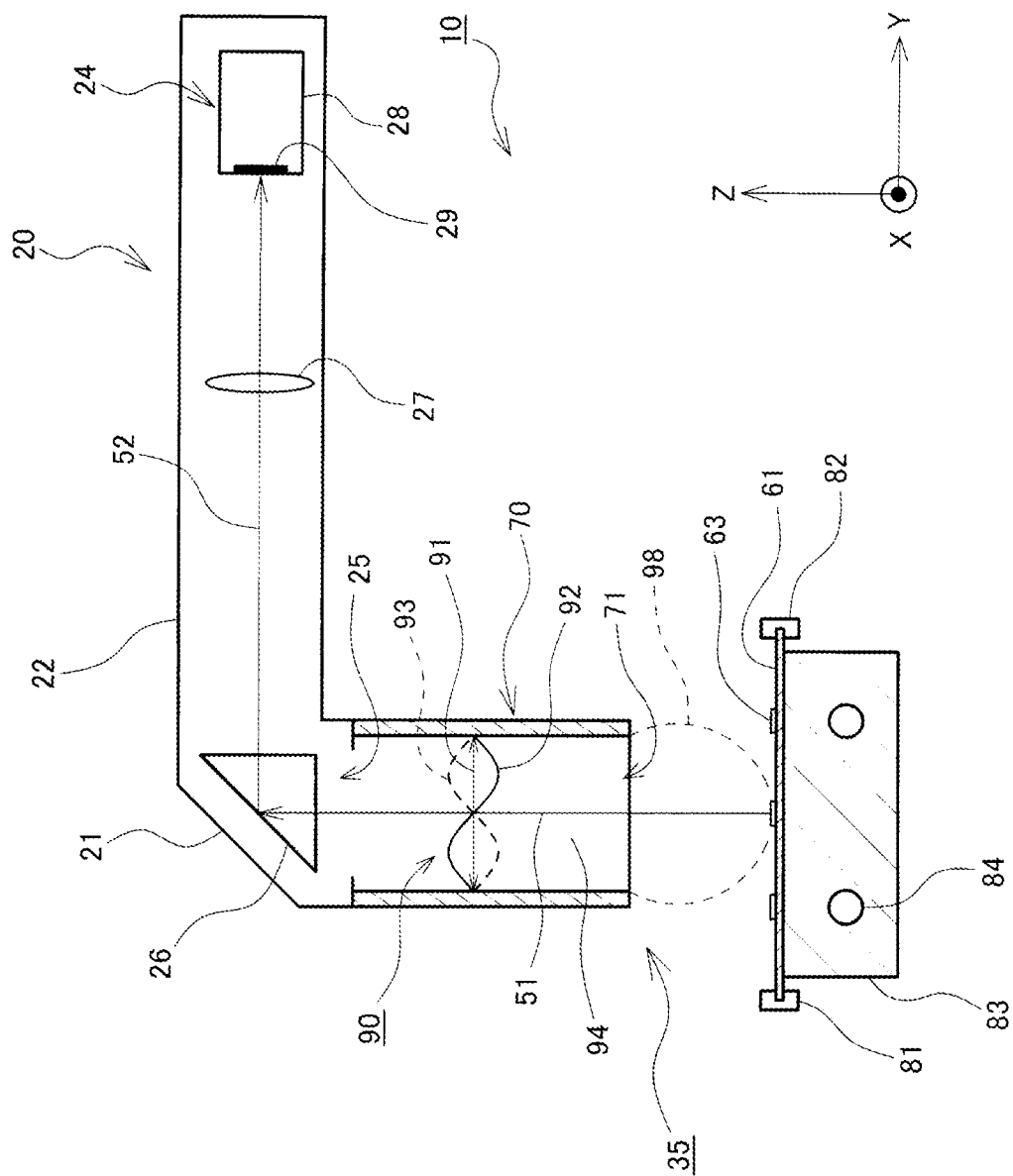
FIG. 13 is a side view of a wire bonding apparatus in which a standing wave generating device is composed of a piezoelectric element forming a tube opened toward a bonding stage according to a further embodiment of the present invention.

In the embodiment shown in FIG. 13, multiple tubular piezoelectric elements 70 are arranged below the opening 25 of the imaging device opened toward the bonding stage 83. As shown in FIG. 13, a standing wave 90 is generated in the space 94 between the piezoelectric elements 70 arranged in a tubular manner. The standing wave 90 leaks out of a lower opening 71 of the piezoelectric elements 70 arranged in a tubular manner toward the upper surface of the bonding stage 83 to form a pseudo standing wave space 98 between the opening 71 and the upper surface of the bonding stage 83. In this embodiment, unlike related art wire bonding apparatuses in which nitrogen gas or air is blown, this pseudo standing wave space 98 can reduce the occurrence of air turbulence and thereby improve the accuracy of image position detection by the imaging device 20 with a simple structure, whereby the bonding quality can be increased.

While in the above-described embodiments, the imaging device 20 is formed by the introducing portion 21 with the prism 26 stored therein, the lens tube 22 with the lens 27 housed therein, and the camera 24, the embodiments may also be applied to a wire bonding apparatus 10 that employs an imaging device 20 in which a lens tube 22 with a lens 27 housed therein and a camera 24 are arranged along the optical axis 51 extending in the Z-axis direction.

The present invention is applicable not only to the wire bonding apparatus 10, but also to other bonding apparatuses (for mounting semiconductor dies 63) such as flip-chip bonding apparatuses in which the bonding stage 83 with the substrate (lead frame) 61 sucked and fixed thereon is heated or mounting apparatuses for mounting electronic components other than semiconductor dies 63 such as LEDs on the substrate (lead frame) 61. Embodiments in which the present invention is applied to die bonding apparatuses for eutectic bonding will hereinafter be described with reference to FIGS. 14 and 15. Components identical to those described with reference to FIGS. 1 to 13 are designated by the same reference signs to omit the description thereof.

Figure 14:
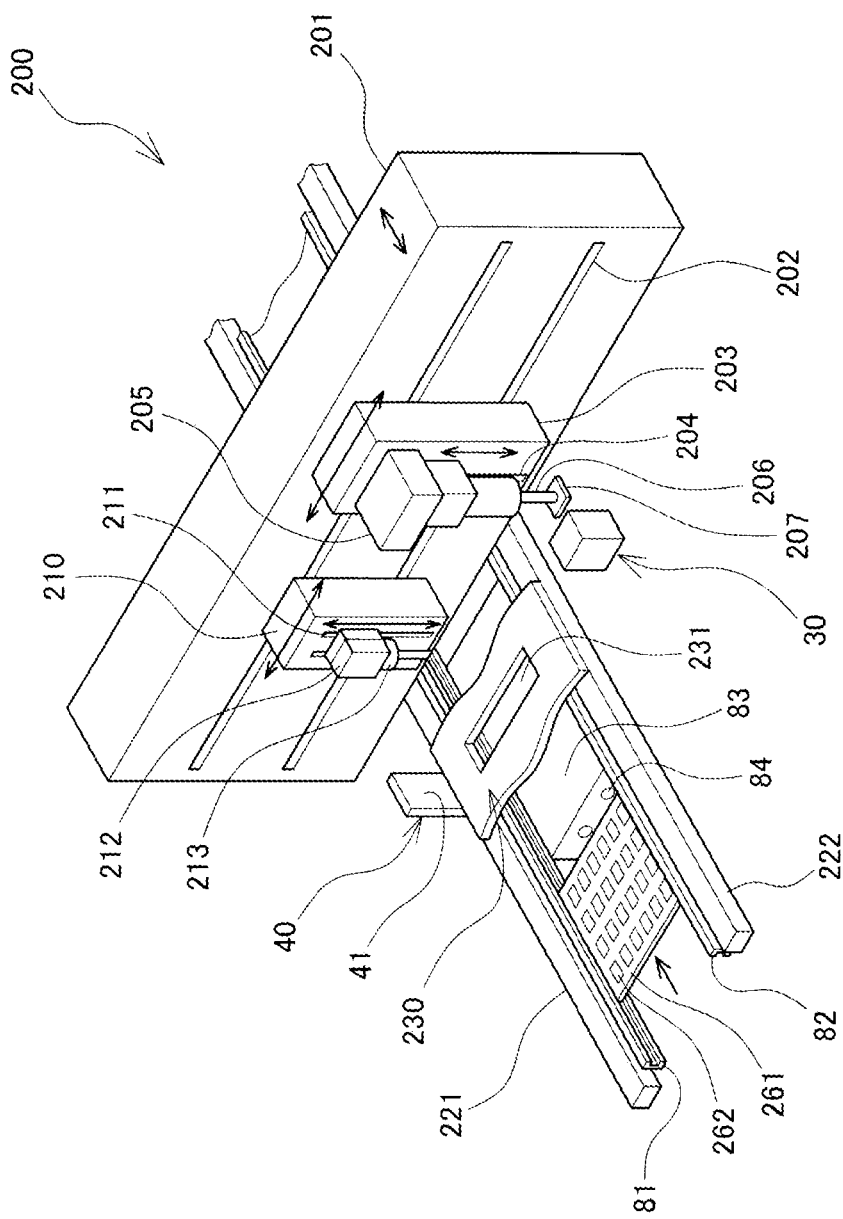
FIG. 14 is a perspective view showing a die bonding apparatus according to an embodiment of the present invention.

As shown in FIG. 14, the die bonding apparatus 200 according to this embodiment includes a Y-direction frame 201 movable in the X direction and provided with Y-direction guides 202, a slider 203 arranged to be guided by the Y-direction guides 202 to move in the Y direction, a bonding arm drive mechanism 205 arranged to be guided by a Z-direction guide 204 in the slider 203 to move a bonding arm 206 and a bonding tool 207 attached to the leading end thereof in the Z direction, a slider 210 arranged to be guided by the Y-direction guides 202 to move in the Y direction, and an imaging section drive mechanism 212 arranged to be guided by a Z-direction guide 211 in the slider 210 to move an imaging device 213 in the Z direction. The die bonding apparatus 200 according to this embodiment also includes left and right frames 221, 222 arranged under the Y-direction frame 201 and extending in the X direction, guide rails 81, 82 attached to the respective left and right frames 221, 222 to guide a lead frame 261 in the X direction, a bonding stage 83 arranged between the guide rails 81 and 82 under the lead frame 261, a cover 230 arranged over the bonding stage 83 and provided with an opening 231, a flat plate 40 attached to a side surface of the left frame 221 on the Y-direction side of the opening 231, and an ultrasonic speaker 30 arranged in a manner opposed to a surface 41 of the flat plate 40.

Figure 15:
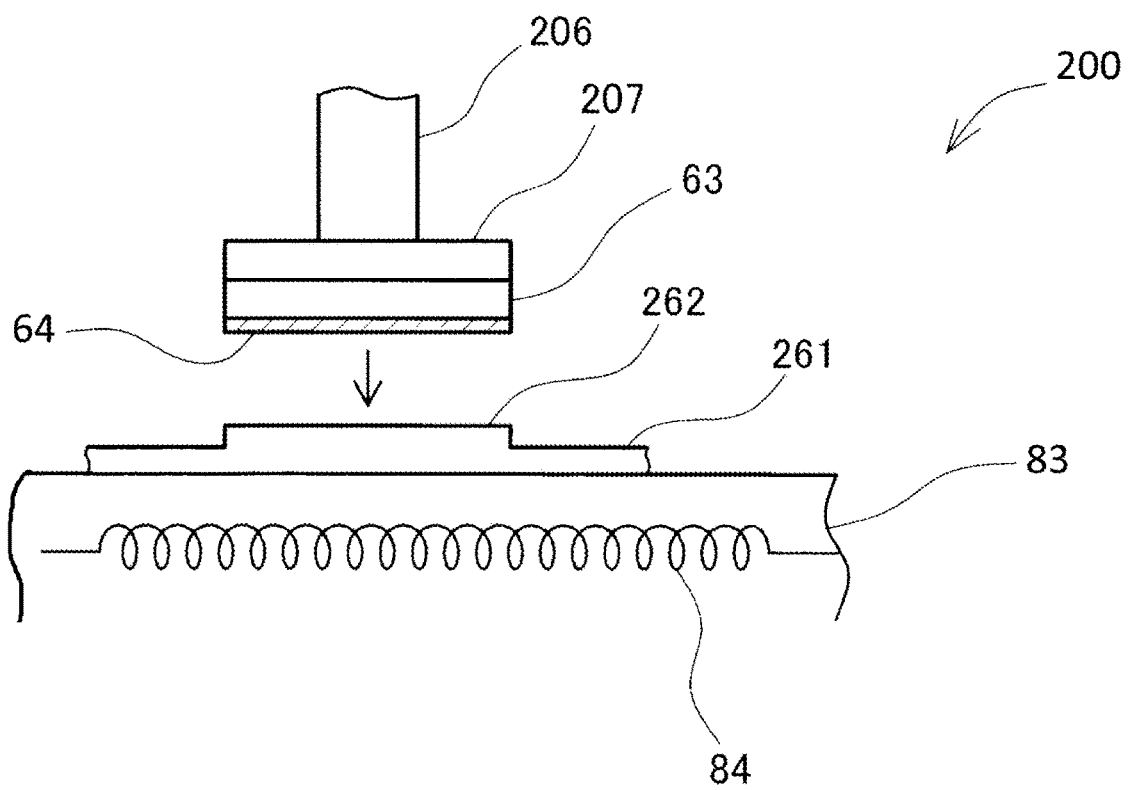
FIG. 15 is an illustrative view showing a bonding operation of the die bonding apparatus shown in FIG. 14.

Next will be described briefly a basic operation of the die bonding apparatus 200 shown in FIG. 14. The lead frame 261 shown in FIG. 14 is fed by a feed mechanism not shown in the X direction and, when an island 262 formed on the surface of the lead frame 261 is fed to the position of the opening 231 of the cover 230, sucked and fixed to the bonding stage 83, as shown in FIG. 15. A heater 84 is arranged in the bonding stage 83 to heat the lead frame 261 sucked and fixed to the bonding stage 83. Next, the imaging device 213 is moved to immediately above the island 262 on the lead frame 261 to image the lead frame 261 and recognize and identify the position of the island 262. Next, the bonding arm 206 is moved to immediately above the island 262, the position of which is detected by the imaging device 213. A semiconductor die 63 is held on the bonding tool 207 that is attached to the leading end of the bonding arm 206. As shown in FIG. 15, the surface of the semiconductor die 63 to be mounted on the island 262 on the lead frame 261 is formed as a gold-plated surface 64. If the lower surface of the semiconductor die 63 is thus gold-plated, the lead frame 261 is to be heated by the heater 84 up to about 400 to 450 degrees C. Once the lead frame 261 is heated up to the temperature, the bonding arm 206 and the bonding tool 207 are lowered to press the lower surface (plated surface) of the semiconductor die 63 held on the leading end against the island 262 on the lead frame 261. Since the lead frame 261 is made of copper or formed by plating copper or silver on the surface of nickel-iron alloy, upon contact with the gold-plated lower surface of the semiconductor die 63 under high temperature, the metals show a mutual eutectic reaction, so that the semiconductor die 63 is bonded to the island 262 on the lead frame 261. In the description above, the lower surface of the semiconductor die 63 is gold-plated. If the lower surface of the semiconductor die 63 is soldered, the lead frame 261 is to be bonded at a heating temperature of about 300 to 350 degrees C.

As shown in FIG. 14, in the die bonding apparatus 200 according to this embodiment, the flat plate 40 is attached to the side surface of the left frame 221 on the Y-direction side of the opening 231 and the ultrasonic speaker 30 is arranged in a manner opposed to the surface 41 of the flat plate 40, whereby an ultrasonic standing wave 90 is generated between the ultrasonic speaker 30 and the surface 41 of the flat plate 40, as described above with reference to FIG. 3. As described above with reference to FIG. 3, the air heated by the surface of the lead frame 261 circulates between the surface of the lead frame 261 and the space over it if no standing wave 90 exists, while the air does not circulate through the space in which the standing wave 90 is generated if the standing wave 90 exists. This causes airs of different temperatures, that is, different densities due to rising air not to be mixed to reduce the occurrence of air turbulence in the space in which the standing wave 90 is generated. As a result, images detected by the imaging device 213 are less likely to fluctuate, resulting in an improvement in the accuracy of image position detection, as described with reference to FIGS. 4 to 6.

As described heretofore, the die bonding apparatus 200 according to this embodiment exhibits the same effect as the above-described wire bonding apparatus 10, that is, unlike related art wire bonding apparatuses in which nitrogen gas or air is blown, the accuracy of image position detection by the imaging device 20 can be improved with a simple structure, whereby the bonding quality can be increased.

Figure 16:
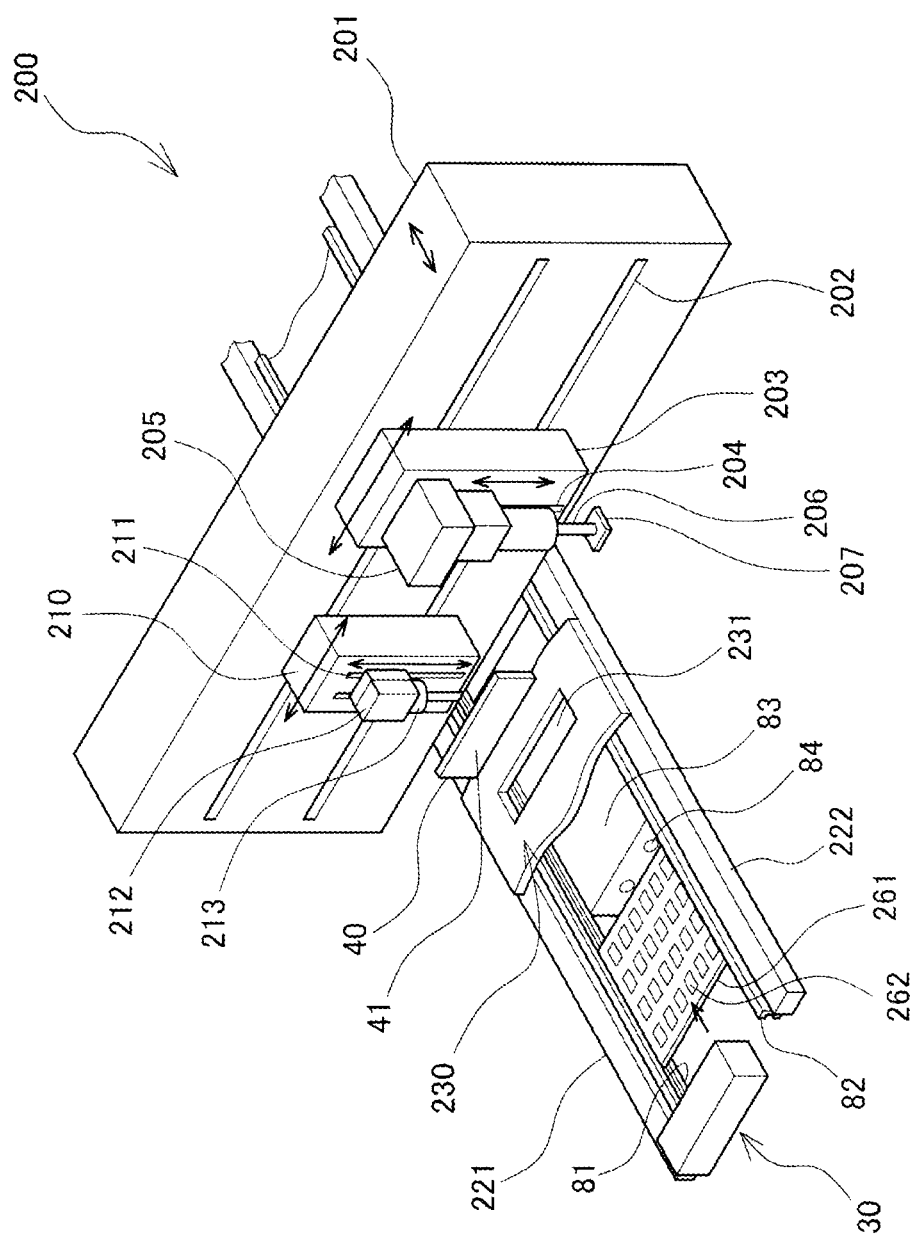
FIG. 16 is a perspective view showing another die bonding apparatus according to an embodiment of the present invention.

Next will be described other embodiments of the die bonding apparatus 200 according to the above-described embodiment with reference to FIGS. 16 to 18. Components identical to those in the embodiments described with reference to FIGS. 1 to 14 are designated by the same reference signs to omit the description thereof.

While in the die bonding apparatus 200 described with reference to FIG. 14, the ultrasonic speaker 30 and the flat plate 40 are arranged in a manner opposed to each other along the Y-direction axis so that the standing wave 90 is generated in the Y direction, the embodiment shown in FIG. 16 has an arrangement in which the ultrasonic speaker 30 and the flat plate 40 are arranged in a manner opposed to each other along the X-direction axis so that an ultrasonic standing wave 90 is generated in the X direction. In this embodiment, the Y-direction length of the flat plate 40 is approximately the same as the Y-direction length of the opening 231 of the cover 230 through which the bonding tool 207 is inserted and removed so that the region in which the standing wave 90 is formed can cover the entire opening 231 in the Y direction. In addition, the ultrasonic speaker 30 is configured to include multiple vibrating bodies 31 arranged in the Y direction to be capable of emitting an ultrasonic wave over an area opposed to the flat plate 40. In addition to the effects of the above-described embodiments, this arrangement makes it possible to generate an ultrasonic standing wave 90 over the whole area above the opening 231. Further, any of the anti-nodes of the standing wave 90 can always be positioned in the vicinity of the opening 231 through which imaging and bonding are performed by adjusting the distance between the flat plate 40 and the opening 231 or the frequency of the ultrasonic wave, whereby the occurrence of air turbulence can be reduced more effectively.

Figure 17:
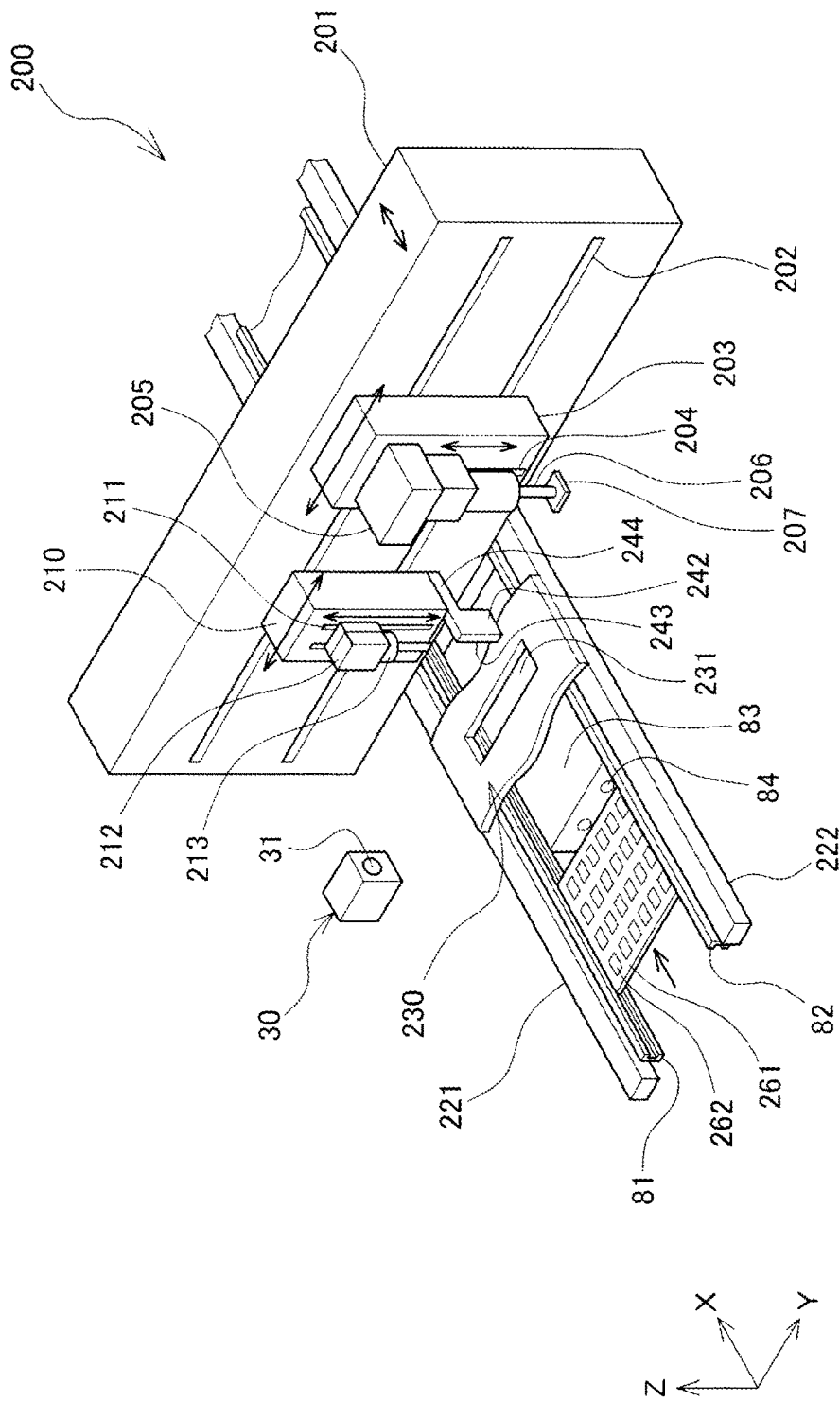
FIG. 17 is a perspective view showing another die bonding apparatus according to an embodiment of the present invention.

The die bonding apparatus 200 shown in FIG. 17 is provided by modifying the die bonding apparatus 200 described with reference to FIG. 14 such that a flat plate 242 for reflecting an ultrasonic wave is fixed to the lower surface of the slider 210 in a manner movable together with the imaging device 213 in the Y direction. The flat plate 242 is fixed to the lower surface of the slider 210 by an arm 244 to be in a position opposed to the ultrasonic speaker 30 attached to a frame not shown. Like the wire bonding apparatus 10 described with reference to FIG. 7, this embodiment has an arrangement in which the distance between a surface 243 of the flat plate 242 and the optical axis of the imaging device 213 is made equal to 1/4 of the wavelength λ of the ultrasonic wave. In accordance with this arrangement, the surface 243 always has a node and one of the anti-nodes of the standing wave 90 can always remain positioned in the vicinity of the optical axis of the imaging device 213 even when the slider 210 may move in the Y direction, whereby the occurrence of air turbulence over the lead frame 261 can be reduced effectively and the accuracy of image position detection by the imaging device 213 can be improved without adjusting the position of the ultrasonic speaker 30 with the movement of the slider 210.

Figure 18:
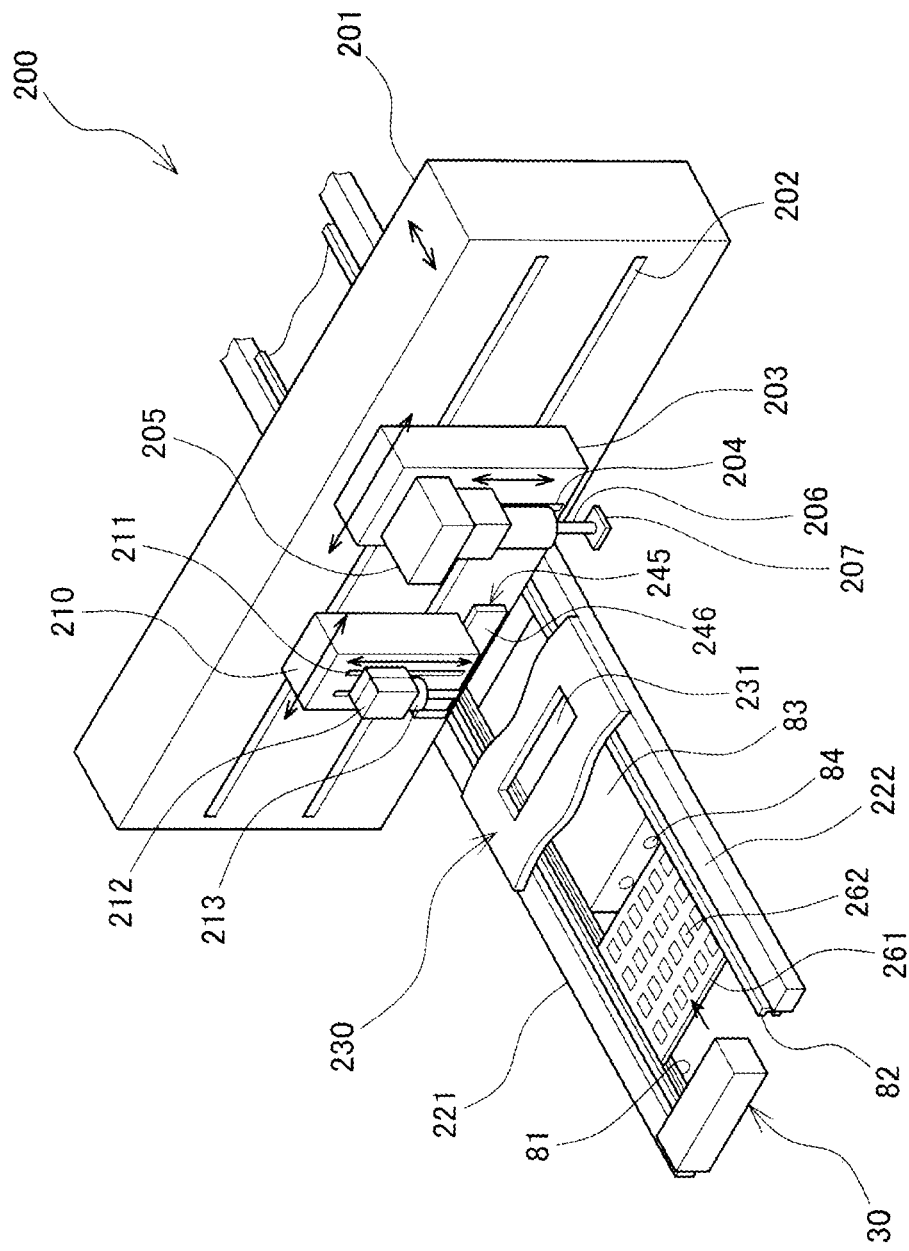
FIG. 18 is a perspective view showing another die bonding apparatus according to an embodiment of the present invention.

In the die bonding apparatus 200 shown in FIG. 17, although the ultrasonic speaker 30 is arranged to face in the Y direction so that the standing wave 90 is generated in the Y direction and the surface 243 of the flat plate 242 serving as a reflection surface for the ultrasonic wave is arranged in the XZ plane, the ultrasonic speaker 30 may be arranged to face in the X direction so that the standing wave 90 is generated in the X direction and a surface 246 of a flat plate 245 serving as a reflection surface for the ultrasonic wave may be arranged in the YZ plane, as shown in FIG. 18. In addition, the flat plate 245 may be fixed not to the imaging device 213 but to the Y-direction frame 201 as long as arranged such that the X-direction distance between the surface 246 and the optical axis of the imaging device 213 is made equal to 1/4 of the wavelength λ of the ultrasonic wave and movable together with the imaging device 213 in the X direction. This embodiment exhibits the same effect as the embodiment described above with reference to FIG. 17.

REFERENCE SIGNS LIST

10 Wire bonding apparatus
11 Bonding head
12 XY table
13 Ultrasonic horn
14 Capillary
15 Clamper
16 Wire
17 Spool
18 Z-direction drive mechanism
20, 213 Imaging devices
21 Introducing portion
22 Lens tube
24 Camera
25, 71, 231 Openings 26 Prism
27 Lens
28 Imaging element
29 Imaging surface
30 Ultrasonic speaker
31 Vibrating body
32, 70 Piezoelectric elements
33 Chassis
35 Standing wave generating device
40, 42, 68, 242, 245 Flat plates
41, 43, 45, 47, 49, 69, 243, 246 Surfaces
44 Half mirror
46 Parabolic mirror
48 Ellipsoidal mirror
51, 52 Optical axes
61 Substrate
63 Semiconductor die
65 Wind Clamper
66 Pressing portion
67 Window portion
81, 82 Guide rails
83 Bonding stage
84 Heater
90 Standing wave
91, 95-97 Arrows
92 Progressive wave
92', 93' Ultrasonic waves
93 Reflected wave
94 Space
98 Standing wave space
100 Control unit
200 Die bonding apparatus
201 Y-direction frame
202 Y-direction guide
203, 210 Sliders
204, 211 Z-direction guides
205 Bonding arm drive mechanism
206 Bonding arm
207 Bonding tool
212 Imaging section drive mechanism
213 Imaging device
221 Left frame
222 Right frame
230 Cover
244 Arm
261 Lead frame
262 Island
λ Wavelength

The invention claimed is:

1. A mounting apparatus comprising:
a mounting stage for heating a bonding target placed on the upper surface thereof and an electronic component mounted on the bonding target;
an imaging device arranged above the mounting stage to image the bonding target placed on the mounting stage or the bonding target and the electronic component; and
a standing wave generating device for generating an ultrasonic standing wave in the space between the upper surface of the mounting stage and the imaging device.

2. The mounting apparatus according to claim 1, wherein the standing wave generating device includes an ultrasonic speaker and a reflection surface for reflecting an ultrasonic wave emitted from the ultrasonic speaker.

3. The mounting apparatus according to claim 2, wherein the reflection surface is a surface of a flat plate arranged in a manner opposed to the ultrasonic speaker.

4. The mounting apparatus according to claim 3, wherein the imaging device is movable in an XY direction, and wherein
the flat plate is arranged to move together with the imaging device in the XY direction.

5. The mounting apparatus according to claim 4, wherein the distance between the optical axis of the imaging device and the surface of the flat plate is $(2n-1)/4$ times (n is a positive integer) the wavelength λ of the ultrasonic wave so that an anti-node of the standing wave is positioned in the vicinity of the optical axis.

6. The mounting apparatus according to claim 3, further comprising a wind clamper for pressing the bonding target or the surface of the bonging target on which the electronic component is mounted toward the mounting state, wherein
the flat plate is attached to the upper surface of the wind clamper in an end portion farther from the ultrasonic speaker.

7. The mounting apparatus according to claim 2, wherein the reflection surface is composed of a surface of a half mirror arranged in an inclined manner between the imaging device and the mounting stage and the surface of the bonding target placed on the mounting stage.

8. The mounting apparatus according to claim 2, wherein the reflection surface is composed of a surface of a curved mirror arranged in a manner opposed to the ultrasonic speaker and a surface of a flat plate arranged in a manner opposed to the curved mirror with the ultrasonic speaker and the mounting stage therebetween.

9. The mounting apparatus according to claim 8, wherein the curved mirror is a parabolic mirror or an ellipsoidal mirror.

10. The mounting apparatus according to claim 1, wherein the standing wave generating device includes two ultrasonic speakers arranged in a manner opposed to each other.

11. The mounting apparatus according to claim 1, wherein the standing wave generating device is a piezoelectric element arranged between the imaging device and the mounting stage to form a tube opened toward the mounting stage, and wherein
a standing wave region is formed between the opening and the upper surface of the mounting stage.

12. The mounting apparatus according to claim 1, wherein the bonding target is a substrate or a lead frame.

* * * * *

UNITED STATES PATENT AND TRADEMARK OFFICE
CERTIFICATE OF CORRECTION

PATENT NO.        : 10,118,246 B2
APPLICATION NO.   : 15/632570
DATED             : November 6, 2018
INVENTOR(S)       : Shigeru Hayata et al.

Page 1 of 1

It is certified that error appears in the above-identified patent and that said Letters Patent is hereby corrected as shown below:

On the Title Page

Item (73) should read as follows:
(73) Assignee: SHINKAWA LTD., Tokyo (JP)

Signed and Sealed this
Twenty-second Day of January, 2019

Andrei Iancu
*Director of the United States Patent and Trademark Office*